(12) United States Patent  (10) Patent No.: US 8,192,809 B2
Gaitas et al.  (45) Date of Patent: Jun. 5, 2012

(54) SCANNING PROBE ASSISTED LOCALIZED CNT GROWTH

(75) Inventors: Angelo Gaitas, Ann Arbor, MI (US);
Bhaskar Mitra, New Brunswick, NJ (US); Amar Basu, Novi, MI (US);
Weibin Zhu, Ann Arbor, MI (US)

(73) Assignee: Picocal, Inc, Ann Arbor, MI (US)

( * ) Notice: Subject to any disclaimer, the term of this patent is extended or adjusted under 35 U.S.C. 154(b) by 351 days.

(21) Appl. No.: 12/464,039

(22) Filed: May 11, 2009

(65) Prior Publication Data

US 2010/0055349 A1  Mar. 4, 2010

Related U.S. Application Data

(60) Provisional application No. 61/094,042, filed on Sep. 3, 2008.

(51) Int. Cl.
*H01T 14/00* (2006.01)
*H05H 1/48* (2006.01)
*C23C 8/00* (2006.01)
*H05B 6/02* (2006.01)
*H05B 6/24* (2006.01)
*H05B 6/00* (2006.01)
*C23C 14/28* (2006.01)

(52) U.S. Cl. ......... 427/580; 427/585; 427/591; 427/595
(58) Field of Classification Search ............... 427/580, 427/585, 591, 595
See application file for complete search history.

(56) References Cited

U.S. PATENT DOCUMENTS

2004/0101469 A1 * 5/2004 Demers .................. 423/447.3
2009/0258166 A1 * 10/2009 Karg et al. .................. 427/595
* cited by examiner

*Primary Examiner* — Kelly M Gambetta
(74) *Attorney, Agent, or Firm* — Jelic Patent Services, LLC; Stanley E. Jelic

(57) ABSTRACT

The present invention is a method for localized chemical vapor deposition (CVD) for localized growing for example for carbon nanotubes (CNT), nanowires, and oxidation using a heated tip or an array of heated tips to locally heat the area of interest. As the tips moved, material such as CNTs grows in the direction of movement. The Scanning Probe Growth (SPG) or nanoCVD technique has similarities to the CVD growth; however it allows for controlled synthesis and direction and eliminates the need for masks.

19 Claims, 36 Drawing Sheets

SCANNING PROBE ASSISTED LOCALIZED CNT GROWTH

CROSS REFERENCE TO RELATED APPLICATIONS

This application claims priority from U.S. Provisional Patent Application Ser. No. 61/094,042, entitled "Scanning Probe Assisted localized CNT growth", filed on 3 Sep. 2008. The benefit under 35 USC §119(e) of the United States provisional application is hereby claimed, and the aforementioned application is hereby incorporated herein by reference.

SEQUENCE LISTING OR PROGRAM

Not Applicable

FEDERALLY SPONSORED RESEARCH

Not Applicable

TECHNICAL FIELD OF THE INVENTION

The present invention is related to localized heating for localized CVD and localized oxidation. For example it can be used for growth of nanotube and nanowire synthesis. More particularly, the present invention is related to the localized heating that is generated using micromachined sharp probes for example for growing nanotubes and nanowires.

BACKGROUND OF THE INVENTION

In one embodiment, carbon nanotubes (CNTs) have unique properties that make them potentially useful in many applications in optics, electronics, nanotechnology, and materials science. CNTs display unusual strength and exceptional electrical properties, and excellent heat conduction. A number of techniques have been developed to synthesize CNTs, these include: laser ablation, arc discharge, high pressure carbon monoxide (HiPCO), and chemical vapor deposition (CVD). CVD growth can occur in vacuum or at atmospheric pressure. A metal nanoparticle may be used as a catalyst. Typical catalysts include nickel, iron, cobalt, or a combination. The catalysts can be patterned, annealed, or plasma etched. Growth of nanotubes is initiated by blending two gases in the CVD reactor. These gases include a process gas like ammonia, nitrogen, hydrogen and a carbon-containing gas like ethylene, ethanol, methane. CNTs grow at the metal catalysts.

There are two major challenges in the field of CNT's: a) a synthesis technique to produce CNTs with reproducible diameter and electronic properties, b) ability to place and align CNTs at desired positions in nanoelectronic circuits. The present invention addresses both challenges. In the nano or micro CVD process, described herein, the substrate is exposed to one or more precursors. The precursors react and/or decompose on the substrate surface. The reaction is directed by the localized heating provided by the heated tips. Eventually the desired deposit is created on the substrate. Nano CVD is a maskless process. A number of materials can be grown on the substrate without a mask. NanoCVD can be used to deposit materials in various forms, including: monocrystalline, polycrystalline, amorphous, and epitaxial. These materials include: various dielectrics, titanium nitride, SiO2, silicon-germanium, silicon, silicon oxynitride, silicon nitride, silicon carbide, localized oxidation, filaments, carbon nanotubes, carbon nanofibers, carbon fiber, tungsten, synthetic diamonds.

BRIEF SUMMARY OF THE INVENTION

The present invention is a method for localized chemical vapor deposition (nano-CVD™) which can be used among other things for growing nanotubes and nanowires. A heated probe tip that can easily be arrayed for multi-probe operation is used to locally heat the area(s) of interest (FIG. 1). The tip has a diameter at submicron lengths for example the length may range from 0.1 nm to 200 nm, more specifically it could for instance be 5 nm. The probe tip may for instance be heated by resistive means. If resistive means are used the probe tip may include an embedded metal resistor or be made of doped silicon or other material that may be heated when a voltage and current is applied through it. As the probe tip is moved, the growth is directed in the direction of movement. The Scanning Probe Growth™ (SPG™) technique has similarities to the CVD growth, however it allows for controlled synthesis and direction at the nanoscale.

DETAILED DESCRIPTION OF THE INVENTION

In the following detailed description of the invention and exemplary embodiments of the invention, reference is made to the accompanying drawings (where like numbers represent like elements), which form a part hereof, and in which is shown by way of illustration specific exemplary embodiments in which the invention may be practiced. These embodiments are described in sufficient detail to enable those skilled in the art to practice the invention, but other embodiments may be utilized and logical, mechanical, electrical, and other changes may be made without departing from the scope of the present invention. The following detailed description is therefore, not to be taken in a limiting sense, and the scope of the present invention is defined only by the appended claims.

In the following description, numerous specific details are set forth to provide a thorough understanding of the invention. However, it is understood that the invention may be practiced without these specific details. In other instances, well-known structures and techniques known to one of ordinary skill in the art have not been shown in detail in order not to obscure the invention.

In the nanoCVD™ or microCVD™ process, described herein, the substrate is exposed to one or more precursors. The precursors react and/or decompose on the substrate surface. The reaction is directed by the localized heating provided by the heated tips. Eventually the desired deposit is created on the substrate. NanoCVD is a maskless process (masklessCVD™). A number of materials can be grown on the substrate without a mask. NanoCVD can be used to deposit materials in various forms, including: monocrystalline, polycrystalline, amorphous, and epitaxial. These materials include: various dielectrics, titanium nitride, SiO2, silicon-germanium, silicon, silicon oxynitride, silicon nitride, silicon carbide, localized oxidation, filaments, carbon nanotubes, carbon nanofibers, carbon fiber, tungsten, synthetic diamonds.

Figure 1:
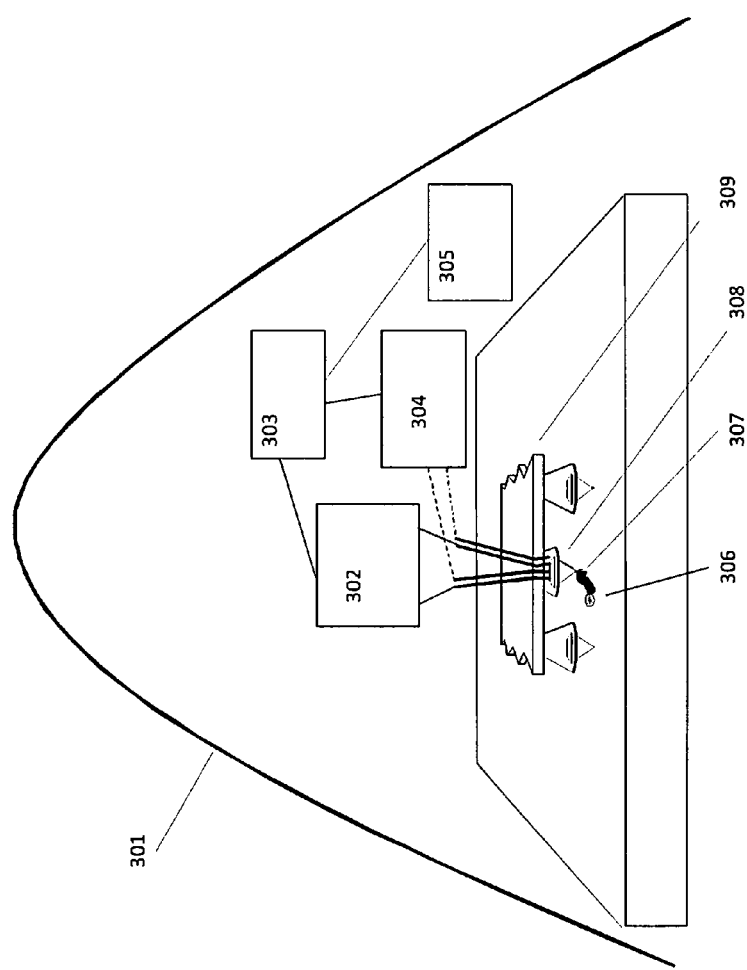
FIG. 1 shows a probe array arrangement.
Figure 2:
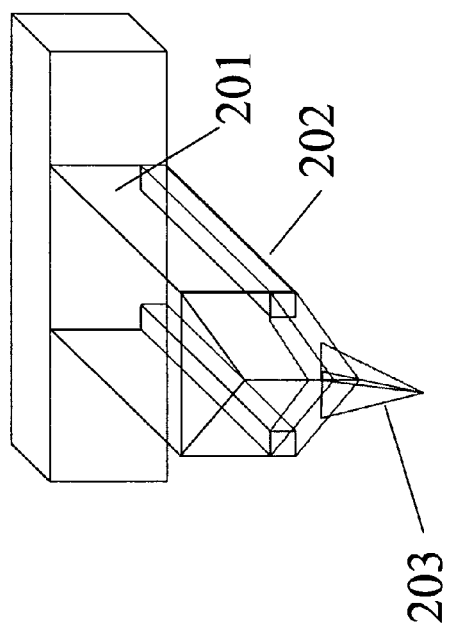
FIG. 2 shows a schematic of the proposed device for scanning probe growth.
Figure 3:
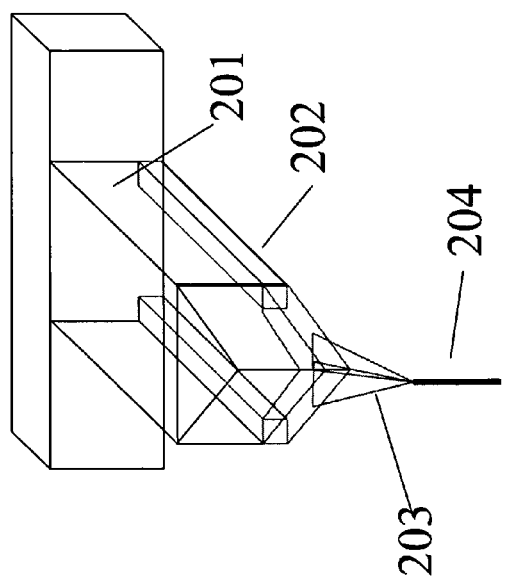
FIG. 3 shows an alternate version of the device for scanning probe growth.

Following catalyst patterning instead of heating the substrate (typically around 700° C.) as it usually done with CVD, a heated probe tip such as resistive probe or probe array is used to locally heat the area of interest (FIG. 1). As the probe is moved, grow will occur in the direction of movement. For example, carbon nanotubes can be grown. The Scanning Probe Growth (SPG) technique has similarities to the CVD growth, however it allows for controlled synthesis and direction. The heated probes may have a tip made of metal, doped Si, Si, SixNy, nano-needles, or CNTs, or other material. The heating thermal element comprises of a pair of conductors extending to a junction at the distal end of the cantilever beam to allow passage of current, the probe tip is thermally connected to the conductors at the junction (FIG. 2). As the bolometer is heated, the tip heats the substrate at the point of contact. The substrate is heated at a diameter similar to the tip. This is because in the nanoscale heat transport is ballistic (as opposed to diffusive), so the high temperature on the substrate is tightly confined. Typical tip diameters may range from 100 nm to a few nm. For example it may have a diameter of 1 nm. Optionally a carbon nanotube may be mounted on the tip to further localize the heat transfer (FIG. 3). In this mode the heat transfer to the substrate is via the carbon nanotube mounted on the tip and thus is localized to the tip diameter.

In a resistive type heater a cantilever with a sharp end (usually a pyramid tip) has two electrically conductive leads which are connected at the distal end of the cantilever near the tip. Joule heating occurs near the tip when a current is applied to the leads. The resistive heaters are design so that most of the heating occurs at the end part of the cantilever. Typically the leads (traces) are made of metals such as gold, tungsten, nickel, doped silicon etc. on silicon cantilevers, silicon nitride cantilevers, poly-silicon cantilevers, or other type of cantilevers. Leads (traces) may also be made by doping silicon or doped poly-silicon. If the material to form the traces is piezoelectric or piezoresistive (such as gold or doped silicon) then the traces may also be used to image topographical variations of the surface allowing an instant image of the nanostructure that was created. Alternatively, a secondary pair of piezoresistive or piezoelectric traces may be used to image the nanostructure. Or an optical technique may be used such as a photo-detector like in an atomic force microscopy arrangement or a triangulation method.

A miniature heater may comprise of a cantilever substrate with a surface and an edge, a cantilever beam section that extends from a proximal end thereof that is secured to the substrate surface outwardly from the edge of the substrate to a distal end thereof, a probe tip extending from the cantilever beam at the distal end of the beam in a direction away from the substrate surface, at least one member selected from the group consisting of: a) a pair of conductors extending to a junction at the distal end of the cantilever beam to allow passage of current through the conductors and through the junction and a tip at the junction of conductors and thermally connected to the conductors, b) a conductor extending to the distal end of the cantilever beam to allow passage of current through the conductor to apply a voltage to the tip, c) a structure to absorb light near the tip for optical heating, or d) a metal deposited for inductive heating near or on the tip.

The setup also allows for imaging using the thermal probe as a scanning probe in a scanning probe microscope arrangement. Topographical scanning allows for quality control of the CNT produced. Multiple probes may be used in parallel to increase throughput, allowing for wafer size localized growth. A piezoresistive or piezoelectric element embedded in each probe cantilever allows for elimination of the use of the optical lever in order to conduct topographical imaging. Optical methods may also be used to detect movement, control movement, and image the fabricated device. The cantilevers may be compatible with an atomic force microscopy system (AFM) or scanning probe microscopy system (SPM). In fact, an AFM equipped with an environmental chamber may be used for SPG.

Figure 4:
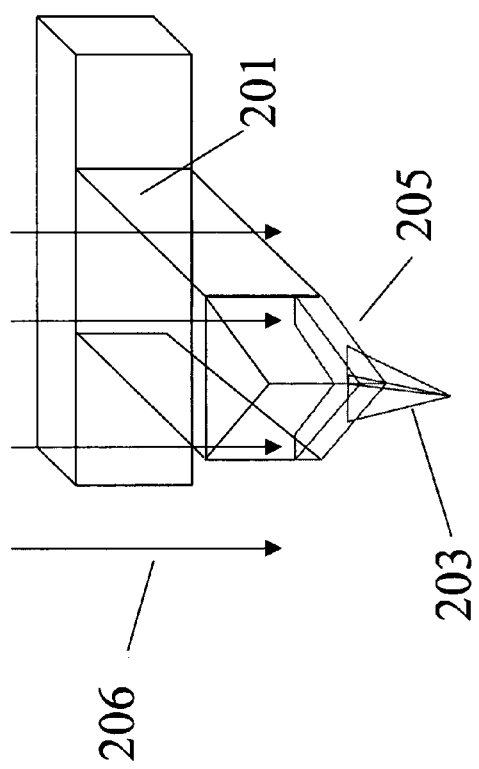
FIG. 4 shows a device for scanning probe growth which employs a nanoscale tip.
Figure 5:
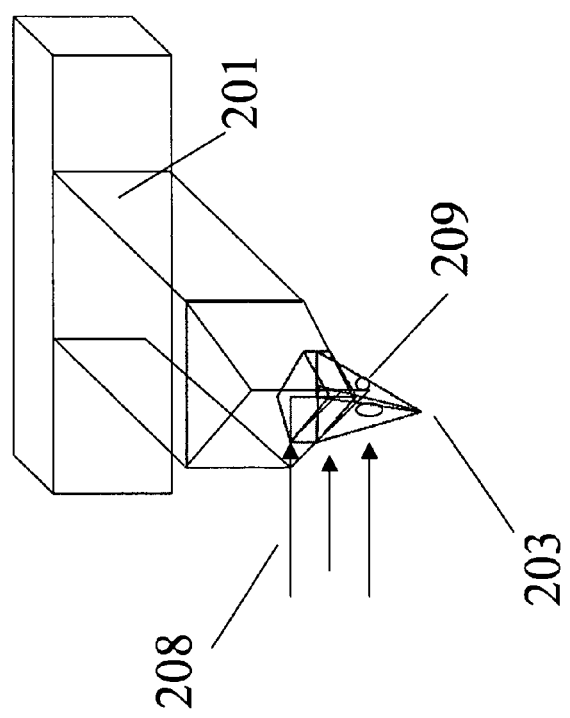
FIG. 5 shows a device for scanning probe growth which employs an inductively heated nanoscale tip.
Figure 6:
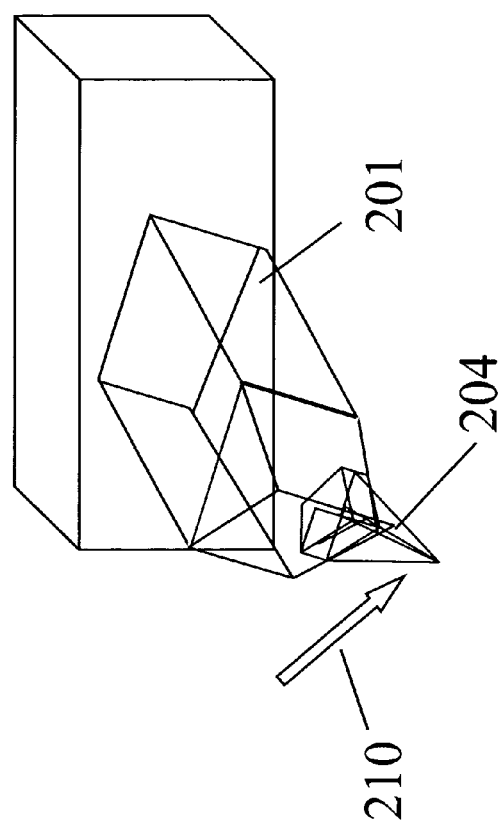
FIG. 6 shows a device for scanning probe growth.

The probe tip may be heated in other ways. In one approach, the probe tip is fabricated with a tiny metal antenna, and exposure to microwave radiation can heat the tip to the reaction temperature while leaving the substrate relatively cool (FIG. 4). The probe tip may also be heated inductively (FIG. 5). The device is placed in an AC magnetic field, and eddy currents generated in the metal heat the tip to the required temperature, without heating the surroundings. The use of high frequency ac magnetic field, confines the current to the "skin depth" and results in greater heating efficiency. A ferromagnetic material may be optionally used to enhance the heating further. The friction caused by rapid magnetization and demagnetization of the material causes the metal film to be heated more efficiently. The probe may also be heated by electromagnetic radiation such as laser radiation focused on the tip (FIG. 6).

In addition to being a fabrication tool, the SPG™ method is also an excellent tool for investigation of the thermodynamics and kinetics of growth since localization and control of heat allows the user to change conditions at the level of individual nanowires. Accordingly new recipes can be developed and applied to fabricate nanowires and nanotubes having desired properties.

The SPG growth technique can be used as a general tool for fabricating, processing (e.g localized annealing), and investigating growth of nanoscale structures in general, not just deposition. It can be applied for example for nanoscale oxidation, etching or annealing.

Optionally the probe may be used with a thin film catalyst, instead of nanoparticle catalyst. Since the growth zone is localized due to heating, it may be possible to grow nanostructures with well defined properties, without using nanoparticles.

The probe may also have a magnetic tip to magnetically move a catalyst (many catalysts are ferromagnetic materials). Instead of the substrate, the catalyst may also be placed on the tip. This has the advantage that the fabricated structures do not depend on the placement of the catalyst, and arbitrary patterns may be generated. In this mode, growth is enabled whenever the current is on. When the current is turned off, growth stops, much like a pen. Alternatively, the substrate may be heated and the probe may just have the catalyst at the tip. When used with a probe which has a carbon nanotube tip, this method will allow the replication nanotube placed at the tip. So it can be used to grow carbon nanotubes with known properties.

This method may be used to grow nanowires or nanotubes vertically and as well as horizontally thereby creating three dimensional structures. For instance a probe or probe array may be used to create circuit connections, transistors, and even vias by moving the probes in three dimensions much like drawing in three dimensions. This method and device may also be used to create three dimensional nanostructures and nanomachines. If material is undesirably grown on the tip(s) then it might be possible to evaporate it by heating the tip to higher temperatures.

FIG. 1 shows a probe array arrangement. This arrangement comprises of an environmental chamber 301, a thermal interface circuit for heating the probe 302, a computer interface for controlling the probe position 303, for viewing topographical images, and for controlling the growth, a topographical sensor interface circuit 304 to control the topographical sensor, an XY scan controller and stage 305 in order to control the movement of the probe(s) and sample relative to each other, an optional catalyst 306, the grown deposit is shown 307, the heated cantilever probe(s) 308 along with the arrayed structure 309 are shown. The chamber 301 may allow for controlled pressure and for increasing pressure to desired levels. The chamber may also allow for controlled temperature and for an increase in temperature. It may include a hot plate under the sample for instance. In the nanoCVD process the substrate is exposed to one or more precursors. The precursors react and/or decompose on the substrate surface. The reaction is directed by the localized heating provided by the heated tips. Eventually the desired deposit is created on the substrate. NanoCVD is a maskless process. A number of materials can be grown on the substrate without a mask. NanoCVD can be used to deposit materials in various forms, including: monocrystalline, polycrystalline, amorphous, and epitaxial. These materials include: various dielectrics, titanium nitride, SiO2, silicon-germanium, silicon, silicon oxynitride, silicon nitride, silicon carbide, localized oxidation, filaments, carbon nanotubes, carbon nanofibers, carbon fiber, tungsten, synthetic diamonds.

NanoCVD may be Aerosol assisted CVD or Direct liquid injection CVD. This method may also be combined with plasma methods such as microwave plasma-assisted CVD, Plasma-Enhanced CVD, and remote plasma-enhanced CVD. Also, this method may be combined with atomic layer CVD, metalorganic chemical vapor deposition, Hybrid Physical-Chemical Vapor Deposition (where chemical decomposition of both precursor gas and vaporization of solid a source occurs), and Rapid thermal CVD (where the substrate is heated). NanoCVD may operate in: atmospheric pressure CVD, low-pressures, and at ultrahigh vacuum ($10^{-6}$ Pa).

Each probe has a cantilever 308 with a sharp tip, a thermal element (which comprises of a pair of conductors extending to a junction at the distal end of the cantilever beam to allow passage of current; the probe tip is thermally connected to the conductors at the junction) and a topographical sensing element (such as a piezoresistor). The probes are placed is an environmental chamber 301 where blending of two gases occurs. Pressure and temperature may be controlled but this is not necessary. The samples may have patterned catalysts 306. As the thermal element 308 heats up locally and is moved CNTs are grown in the area of probe movement.

In FIG. 1 an atomic force microscope (AFM) or scanning probe microscope (SPM) (both terms used interchangeable from hereon after as SPM) can also be included. For instance an SPM with a chamber can be used. The probe tip or tip array is mounted on the SPM holder. If resistive heating is used then electrical connections, much like in scanning thermal microscopy, are used connecting the tip or tip array to interface electronics residing outside of the chamber. Then the SPM laser is focused on the tip and reflected onto a photo-detector, much like a typical SPM. Precursor gases are pumped through the inlets of the chamber. The tip or tip arrays are brought in contact with the sample substrate and the tip or tip arrays are ether used for scanning the substrate for topographical mapping or for nanoCVD. Scanning thermal microscopy is also possible with this set-up. After nanoCVD the tips may be used again to image the substrate and the nanostructure created.

Figure 21:
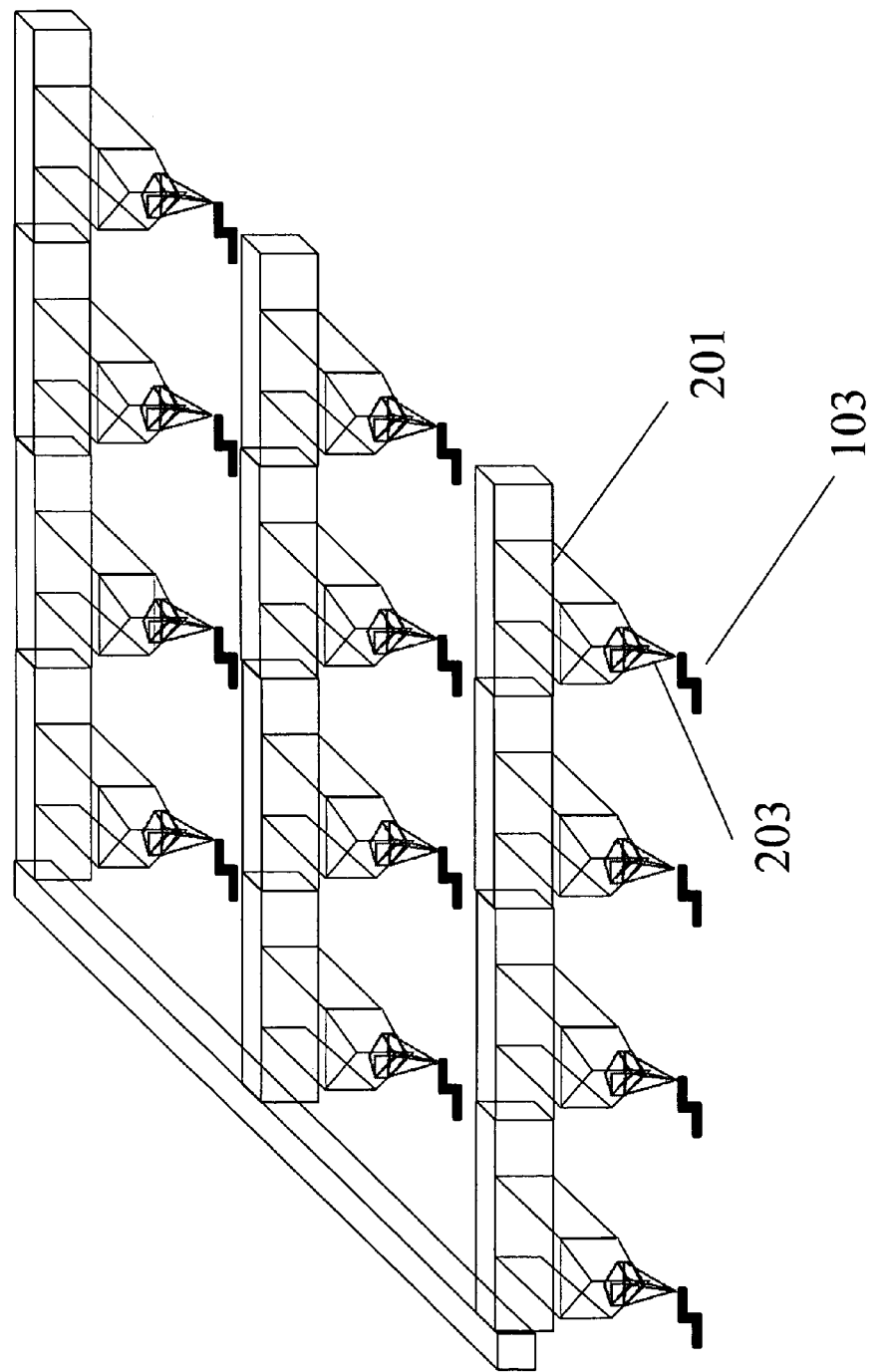
FIG. 21 shows a probe array for massively parallel growth.

FIG. 21 illustrates a two (2) dimensional probe array for highly parallel mass growth, where the 201 cantilever and 203 nanoscale tip are shown. 103 shows the nanodevice (CNT) that has been grown with this method. Two dimensional or three dimensional devices can be designed. This array can be extended to any number of probes and cantilevers. Any method from the ones described in this disclosure can be used to heat the tip including lasers, resistive, inductive heating etc.

Figure 28:
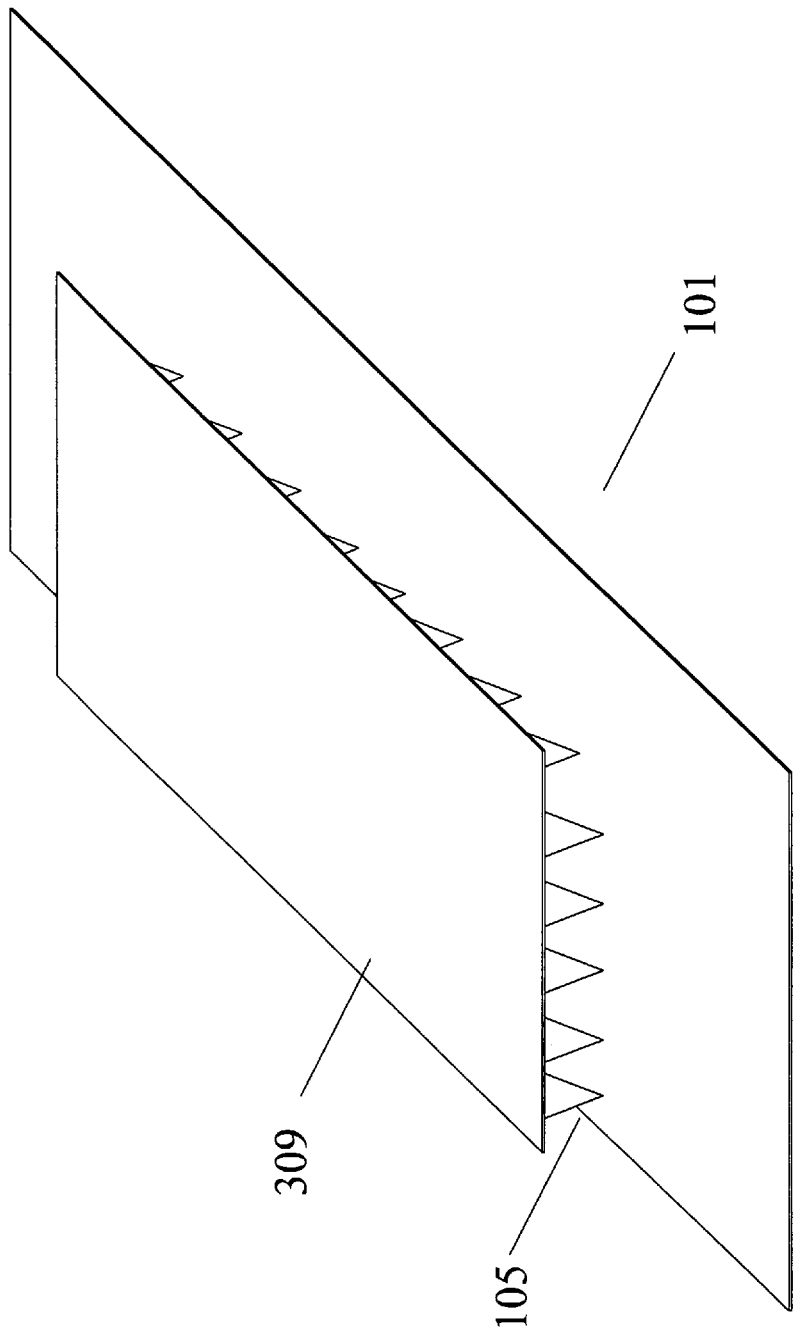
FIG. 28 shows a multi-heater triangular tip arrangement without cantilevers.
Figure 29:
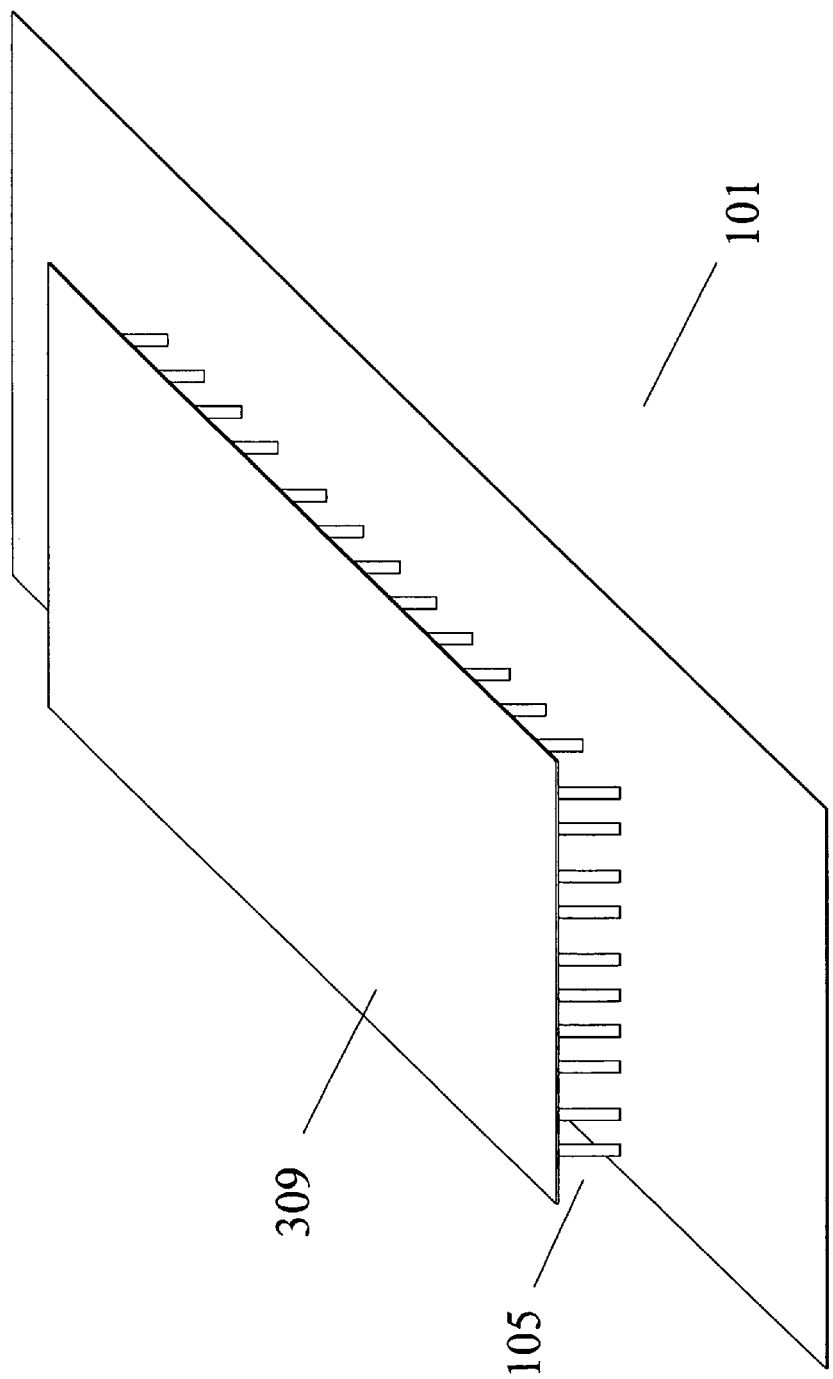
FIG. 29 shows a multi-heater tip arrangement without cantilevers.

An embedded electrical lead may also be included so that an electric field may be formed between each tip and the sample for controlled growth. These types of arrays allow for massively parallel growth and therefore are particularly appealing, for instance, in manufacturing settings for semiconductor applications where entire wafers can be used simultaneously. FIGS. 28 and 29 illustrate alternative designs of two dimensional probes arrays in which the heated tips 105 are not connected to cantilevers but to a solid frame (309). The heated tips (105) can be either triangular/pyramid shaped or tube-like or square-like. The heated tips could be needle shaped. The tips are held together by a frame (309) which permits heating individual heaters either resistively or through other mechanisms described in the document via embedded circuitry or other means. As previously, the heaters are either in contact or suspended over the substrate 101 at a small distance from the substrate heating locally only the area of interest. The locally heated area could have a width of for example between 1 nm and 200 nm and it can be controlled by the tip's diameter. The heaters are then heated and moved in the XYZ direction to direct growth. A mechanism can be used to control the contact force and/or distance from the substrate. In FIGS. 28 and 29, the entire frame 309 may also be heated. In this case the heat transfers to individual tips 105 and locally heats the substrate 101. This further simplifies the process since individual heating is not required for each tip.

FIG. 2 shows a schematic of the proposed device for scanning probe growth comprising of a 201 cantilever, 202 metal traces, and 203 nanoscale tips. Resistive heating is used to heat the tip to the desired temperatures.

FIG. 3 shows an alternate version of the device for scanning probe growth, additionally employing a nanowire projection 204 to transfer heat to the substrate. The heating is by ballistic transport, which it confines the heat to the spot size of the nanowire (nanoneedle).

FIG. 4 shows a device for scanning probe growth which employs a nanoscale tip 204 that is heated by microwave radiation 206. The small antenna at the tip 205 is used to localize the absorption of radiation.

FIG. 5 shows a device for scanning probe growth which employs an inductively heated nanoscale tip. An AC magnetic field 208 causes heated by eddy currents 209 (localized on the surface of metal tip). A ferromagnetic material may be employed to provide additional heating from rapid magnetization and demagnetization of the metal in the ac field. An AC magnetic field can be generated by a coil for example which is connected to at function generator or by other means.

FIG. 6 shows a device for scanning probe growth which employs a tip heated by laser radiation 210.

Figure 7:
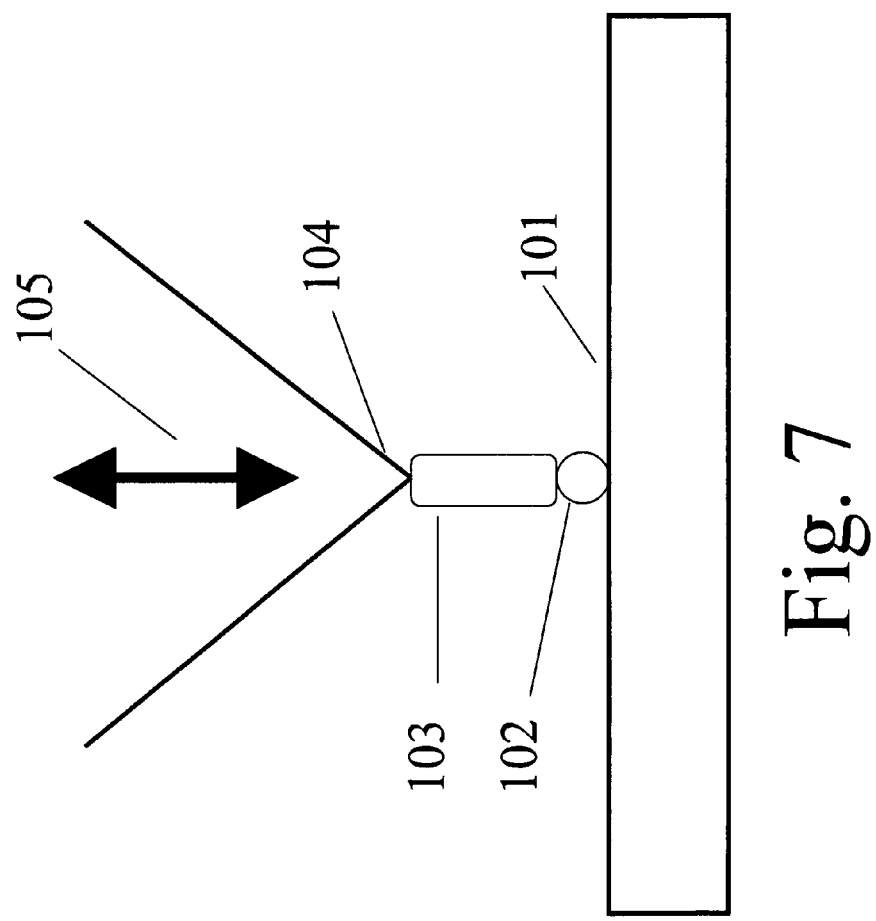
FIG. 7 shows growth of vertically oriented nanostructures (e.g CNT) using SPG method.

FIG. 7 shows growth of vertically oriented nanostructures (e.g CNT) using SPG (nanoCVD) method. The substrate 101 is seeded with nanoparticle catalysts 102. The probe 104 is moved vertically 105 causing vertically oriented nanowires to be formed.

Figure 8:
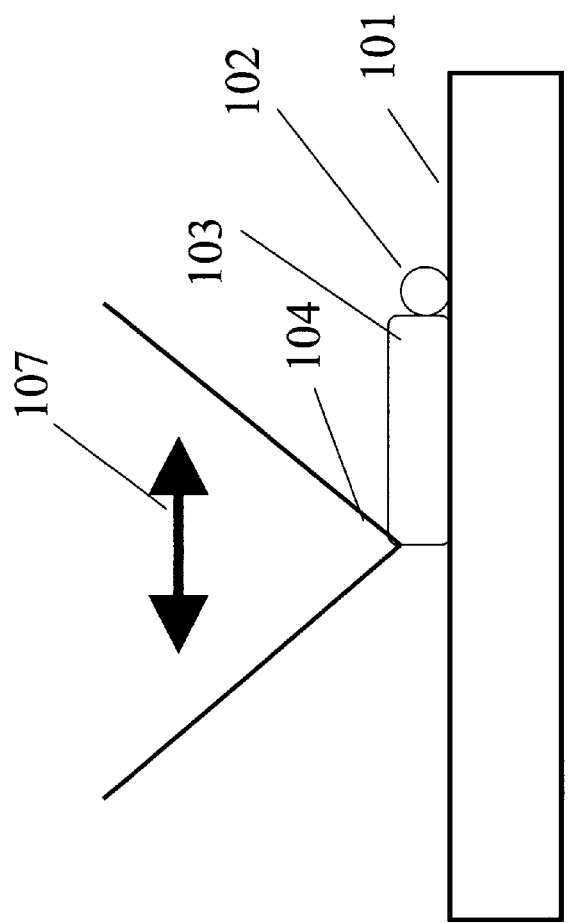
FIG. 8 shows growth of horizontally oriented nanostructures by the SPG method.

FIG. 8 shows growth of horizontally oriented nanostructures by the SPG method. The probe is moved parallel to the substrate 107, resulting in nanotubes on the substrate.

Figure 9:
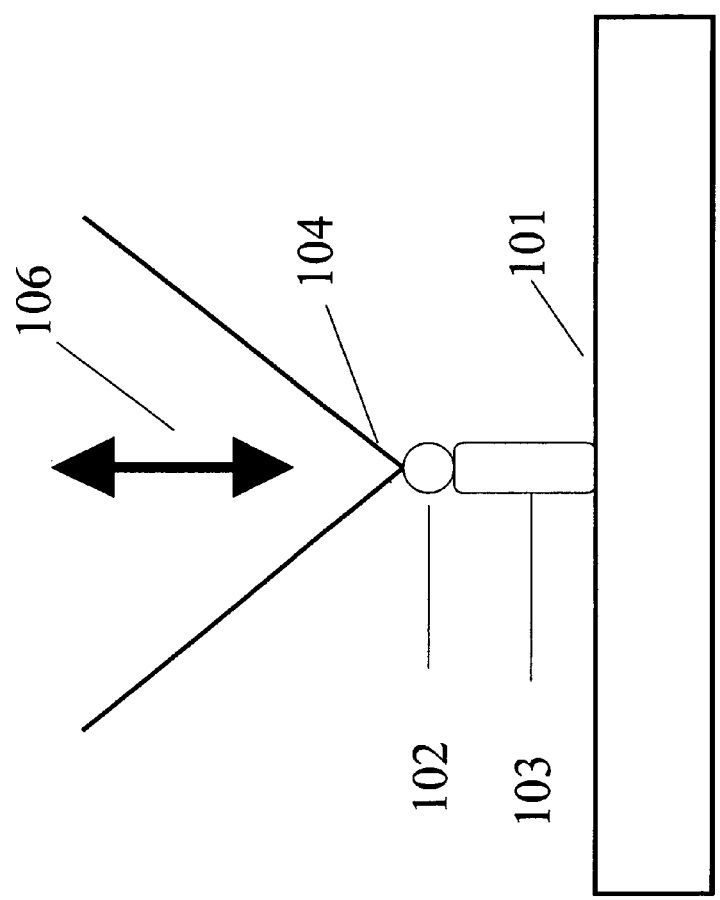
FIG. 9 shows growth of vertically oriented nanowires from the catalyst deposited on the tip 102.

FIG. 9 shows growth of vertically oriented nanowires from the catalyst deposited on the tip 102. After the growth wire makes contact with the substrate the tip is cooled and the wire sticks to the substrate, due to Van-der-Wall's forces.

Figure 10:
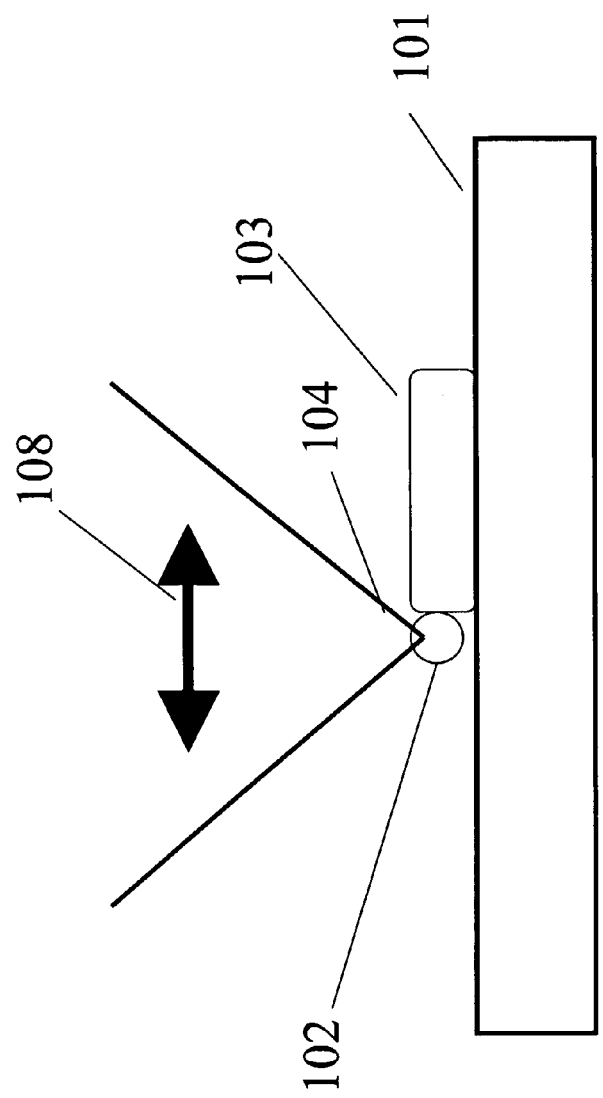
FIG. 10 shows growth of horizontally oriented nanowires from the catalyst deposited on the tip.

FIG. 10 shows growth of horizontally oriented nanowires from the catalyst deposited on the tip. This technique may be used for making nanotransistors, or making nanowire contacts between two structures.

Modeling of heat transfer between AFM tip and substrate: The purpose of this model is to calculate the temperature distribution on the substrate surface when a heated tip is brought in contact with a sample. Localization of temperature is crucial in achieving controlled growth of nanotubes and a change in temperature distribution can impact the diameter, chirality and the form of the nanotubes.

The various heat transfer processes between the tip and sample can be classified as:
1. Solid-Solid Conduction through tip contact
2. Solid-Gas conduction through the air gap
3. Convection through the air gap
4. Radiation from the heated tip
5. Conduction through the liquid meniscus Of these solid-solid conduction is the most important mode of heat transfer (Handbook of Heat Transfer: Warren M. Rohsenow, James P. Hartnett, Young I. Cho, L. Shi and A. Majumdar, "Thermal Transport Mechanisms at Nanoscale Point Contacts," Journal of Heat Transfer, Vol. 124, pp. 329-337 (2002)). For steady state heat transfer the Laplace equation applies:

$$\nabla^2 T = 0$$

The heat flux is given by a simple linear relationship, where k is the thermal conductivity.

$$\frac{q_x}{A_x} = k\frac{\partial T}{\partial x}, \quad \frac{q_y}{A_y} = k\frac{\partial T}{\partial y}, \quad \frac{q_z}{A_Z} = k\frac{\partial T}{\partial z}$$

The thermal conductivity itself is a function of temperature, so the relationship is non-linear when the difference in temperature is large.

The heat transfer by convection is given by:

$$\frac{q_{conv}}{A} = h(T_{wall} - T_0)$$

Where h is known as the heat transfer coefficient of convection. For the interaction between a nanoscale tip and the substrate, due to the small gaps there is limited circulation of the air, and hence the impact of natural convection in heat transfer is likely to be negligible.

Finally the heat transfer by radiation is given by Stefan's law.

$$\frac{q_{rad}}{A} = \sigma\varepsilon(T^4 - T_0^4)$$

While this is not significant at room temperatures, it is likely to be a significant heat loss mechanism at elevated temperatures.

Due to the axial symmetry of the tip-substrate structure, a 1-D model is sufficient to capture the details of the process. The tip is assumed to be made from gold. The boundary conditions are that the temperature at the top end of the tip is 973K and the temperature at the bottom of the glass is 273K. Preliminary simulations showed that the temperature changes are significant only within few nanometers of the contact point, so only a 1 micron section of the glass is chosen.

The model takes into account heat loss from the tip by convection and radiation, as well as the temperature dependent thermal conductivity of air and glass, and the temperature dependent heat capacity, and density of air.

Figure 11:
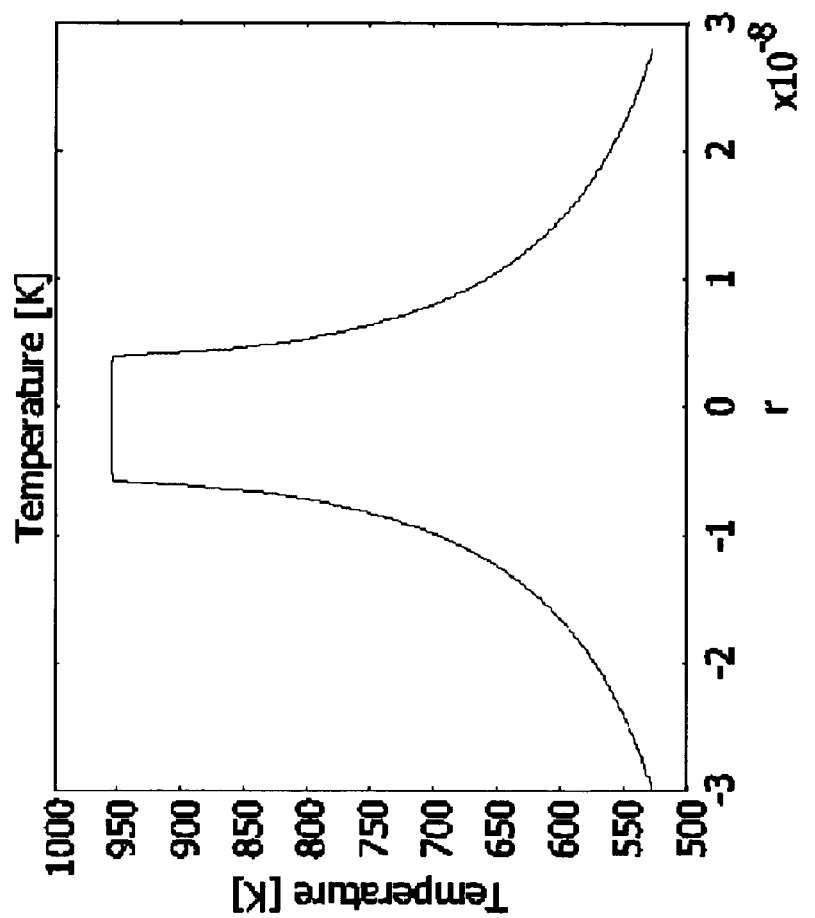
FIG. 11 shows surface temperature distribution of a 10 nm diameter tip at 700 C in contact with a glass substrate at the point of contact.
Figure 12:
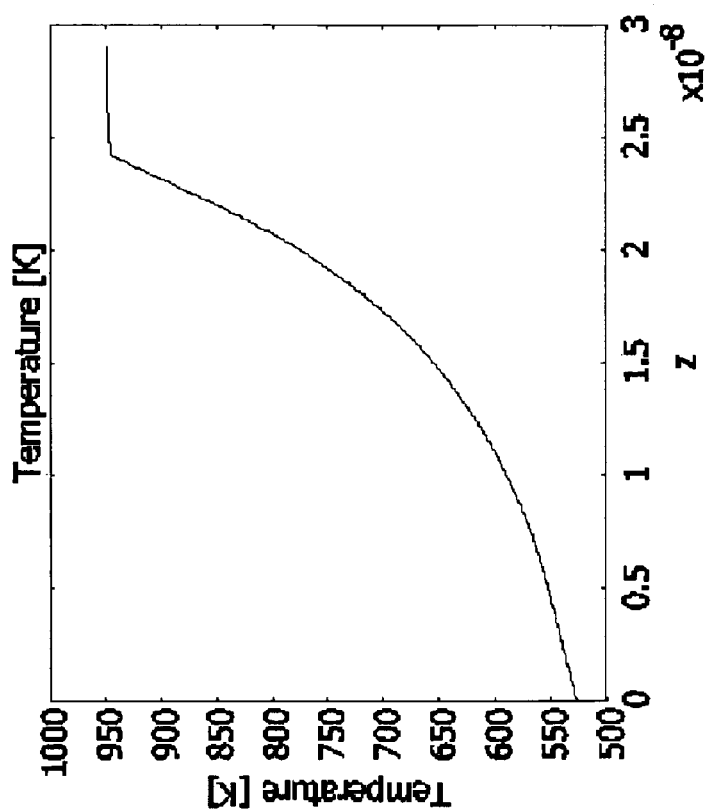
FIG. 12 shows the temperature distribution perpendicular to the substrate at the point of contact for a 10 nm diameter tip at 700 C

FIG. 11 shows the results of the simulations with a 10 nm diameter probe. The dominant mechanism of heat transfer is seen to be solid-solid conduction, and the spot size is seen to be few nanometers around the point of contact. The probe angle was 45 degrees. In practice the angle is slightly larger, thus providing even better contrast. FIG. 11, shows a plot of the surface temperature. The drop in temperature is dramatic. A 200 degree change in temperature is seen within a gap of 5 nm, which suggests that the spot size is quite small. A similar change in temperature is seen in the plane perpendicular (FIG. 12) to the surface at the point of contact.

Figure 13:
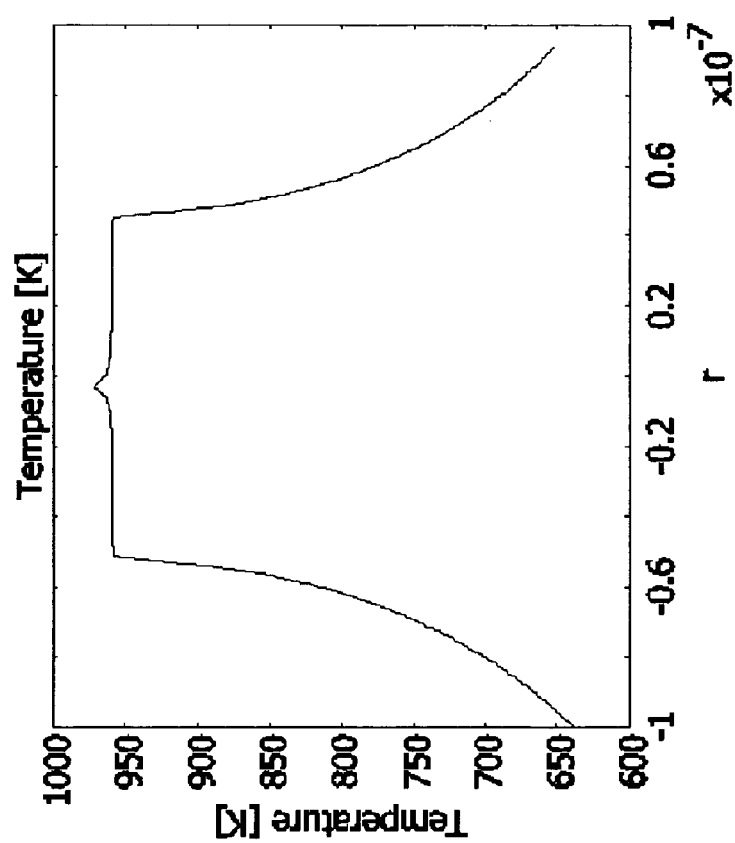
FIG. 13 shows temperature distribution on the surface of the substrate for a 100 nm tip.
Figure 14:
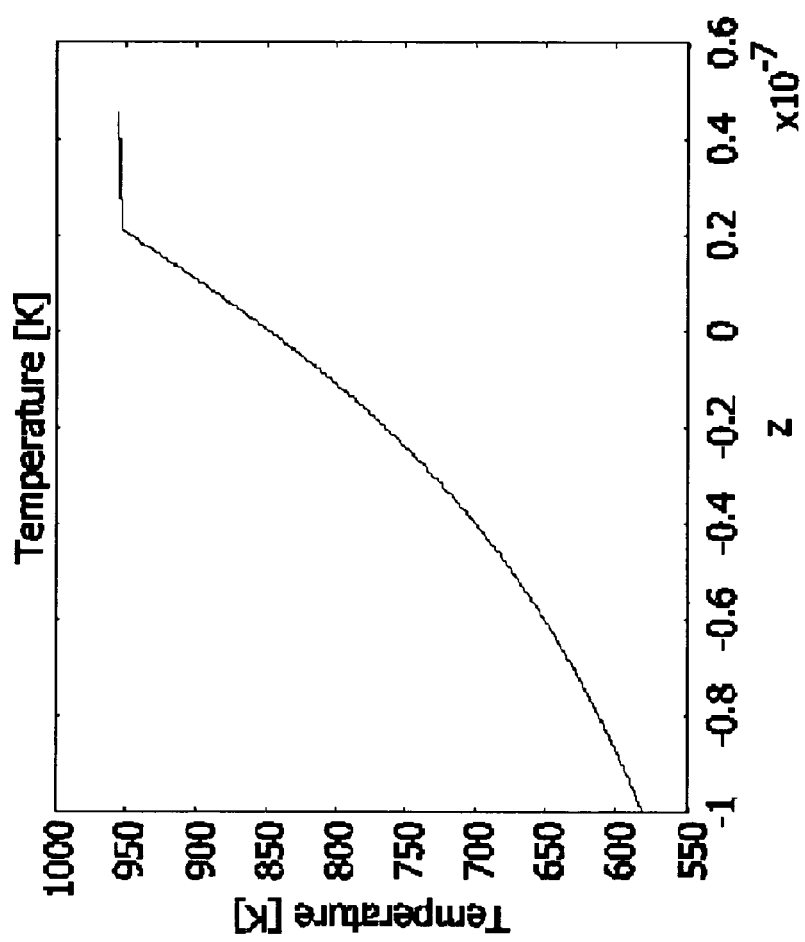
FIG. 14 shows temperature distribution perpendicular to the substrate at the point of contact for a 100 nm tip.

FIG. 13 shows the results of the simulation with a 100 nm tip. Even in this case the spread in the spot is quite small. As seen in FIG. 13, the surface temperature drops in a similar manner, showing a drop of 200 degrees over a gap of 10 nm. A similar change in temperature is seen in the plane perpendicular (FIG. 14) to the surface at the point of contact. Thus it is safe to conclude that the heating can be confined to a small area when using a PicoCal thermal probes.

Figure 15:
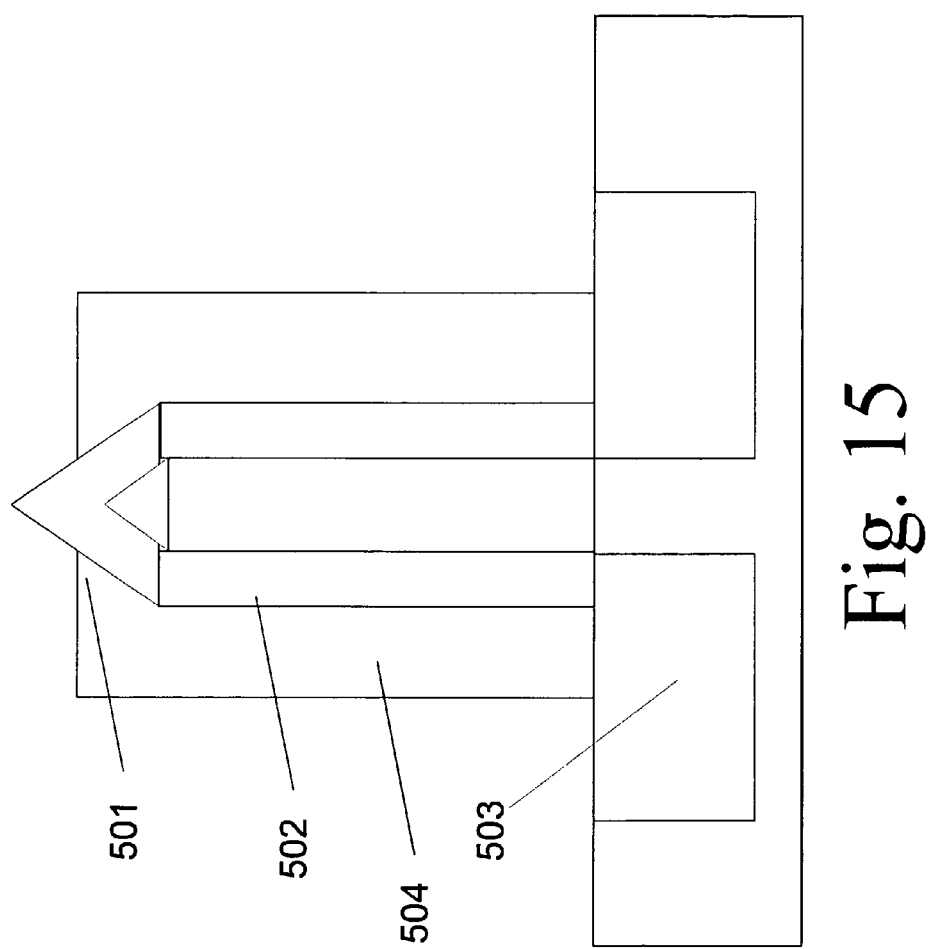
FIG. 15 shows a probe design.
Figure 16:
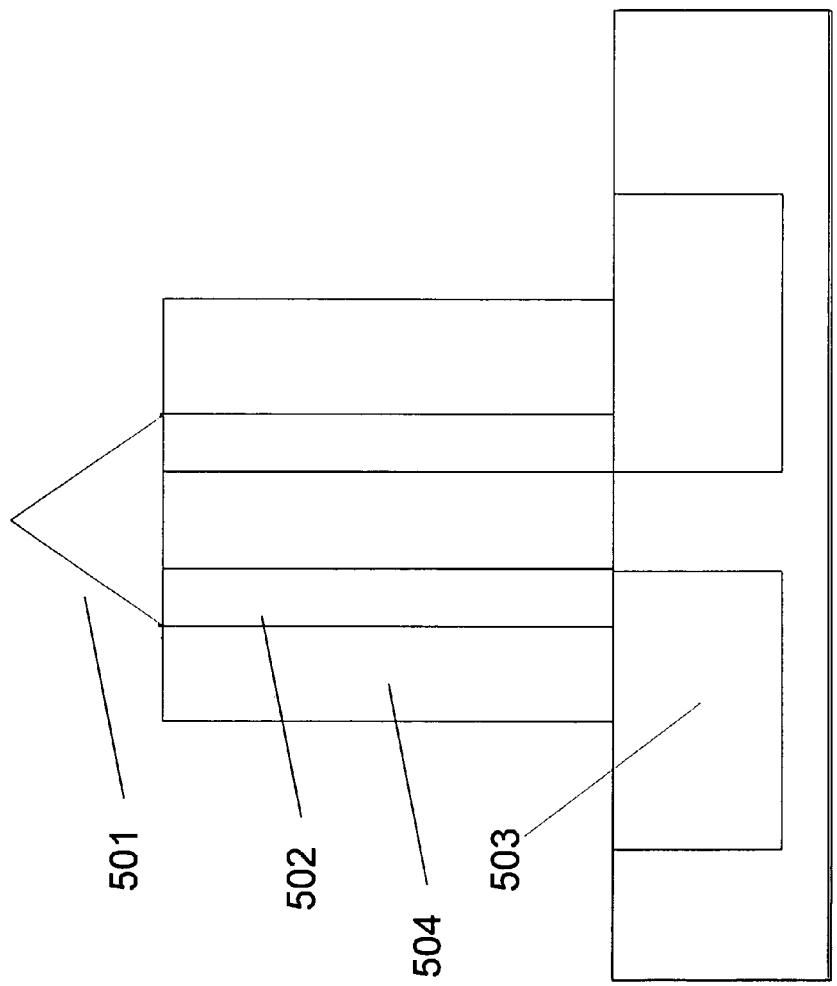
FIG. 16 shows a probe design.

FIG. 15 and FIG. 16 illustrate other probe designs. In FIG. 15, a triangular shape tip (501), conductive traces that run all the way to the tip from the chip's substrate, conductive pads for connecting electrically the traces to a power supply (503), cantilever (504). In FIG. 16, conductive traces that run all the way to the tip from the chip's substrate, conductive pads for connecting electrically the traces to a power supply (503), cantilever (504). The triangular shape tip 501 does not extrude out of the plane but is on the same plane as the cantilever. The probe from FIG. 16 can be microfabricated using surface micromachining.

Figure 36:
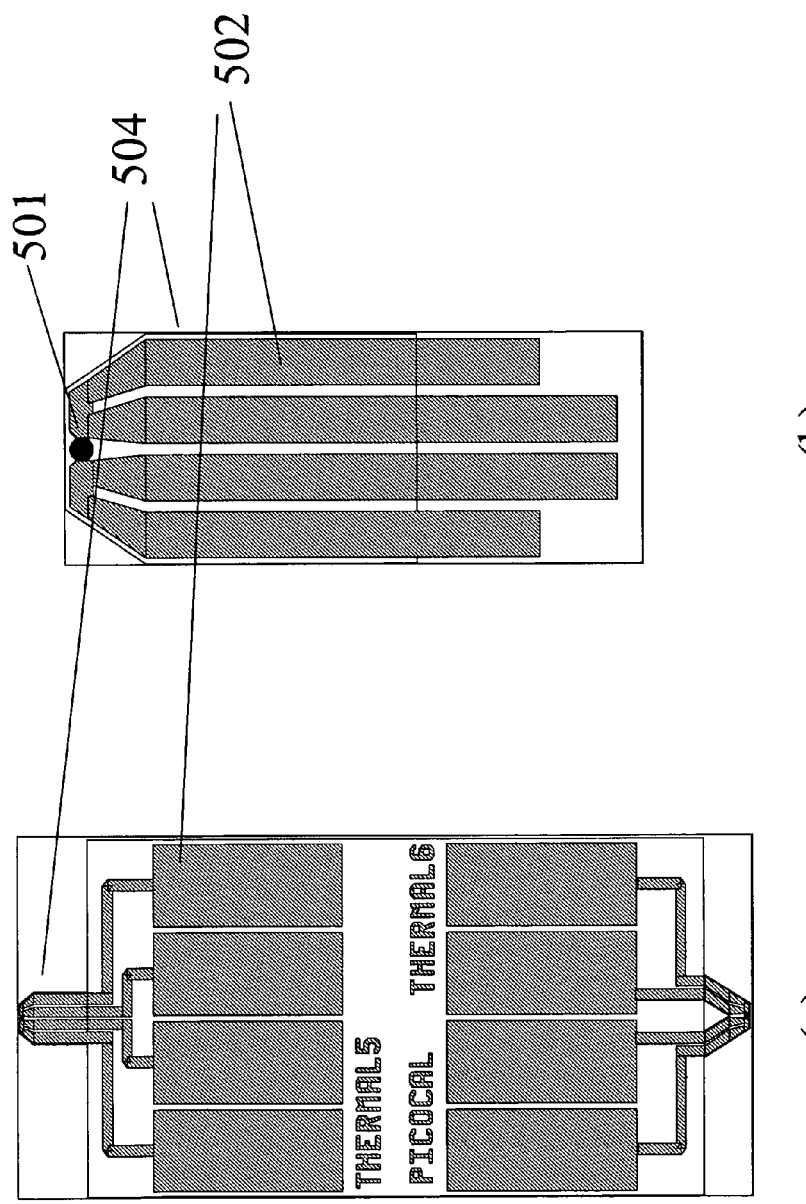
FIG. 36 illustrates four point thermal probe designs.

FIGS. 36 (*a*) and 36 (*b*) illustrate a four point probe, these type of probes have four leads all connected at the tip. 36 (*b*) illustrates an entire chip with two probe tip designs on each chip. A tip (501) is shown with conductive traces 502 that run all the way to the tip from the chip's substrate; conductive pads for connecting electrically the traces, the traces are on a cantilever (504). This design can easily be arrayed to a multi-probe array. However, it is not necessary that the four point designed is used on a cantilever. The same design may be used on a large frame with a number of tips. The designs of FIG. 36 design allow for heating the probe tips and the measuring of the voltage at the tip with the two inner leads. This way the temperature of the tip can be measured more accurately by confining the measured area at the tip. The probe tip then acts as a heater and a temperature measurement device. The inner and outer leads may be made from any material such as the ones mentioned below including platinum, iridium, rhodium or palladium. Instead of a resistor (bolometer), a thermocouple may be included for measuring temperature. For example, an Rh/Ir thin-film thermocouple that has the best properties for temperatures above 900° C. may be included in the inner leads.

The fabrication process may include, first, tip formation by isotropic DRIE dry etching with an oxide layer as etch mask. Second, the tip sharpening by growing 1 μm thermal oxide followed by a BHF oxide removal step. Third, an LPCVD $SiO_2/Si_3N_4/SiO_2$ (ONO) layer 1.1 μm deposition on the Si substrate, and cantilever structure patterning by a sequence of ONO etching steps. The $SiO_2/Si_3N_4$ layer around the tip then removed. Fourth, the metals patterned with a series of lift-off processes. Finally, the backside of the wafer etching using DRIE dry etching for device release and 20 nm aluminum deposition on the backside. ONO arms are designed for holding the devices on the wafer-frame and for easy detachment from the frame.

Figure 17:
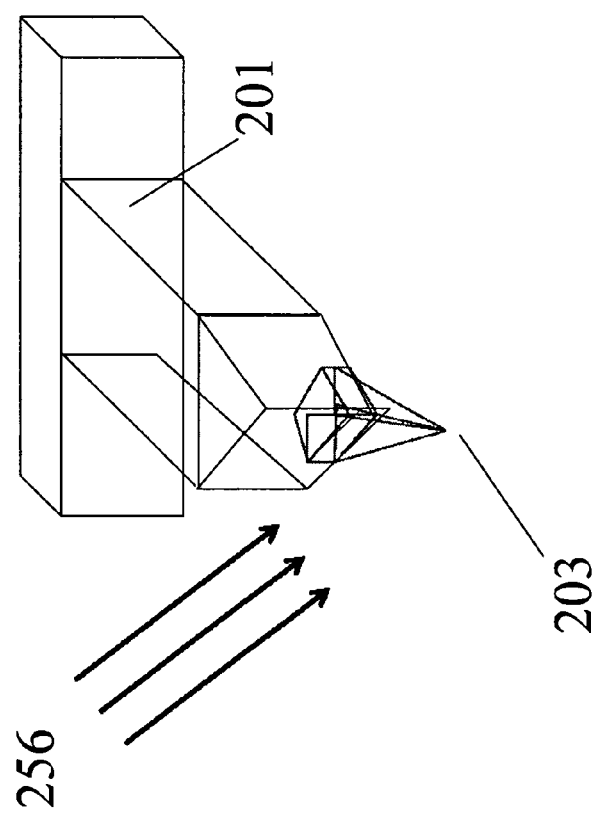
FIG. 17 shows an electromagnetic heating of the tip (example by laser).
Figure 18:
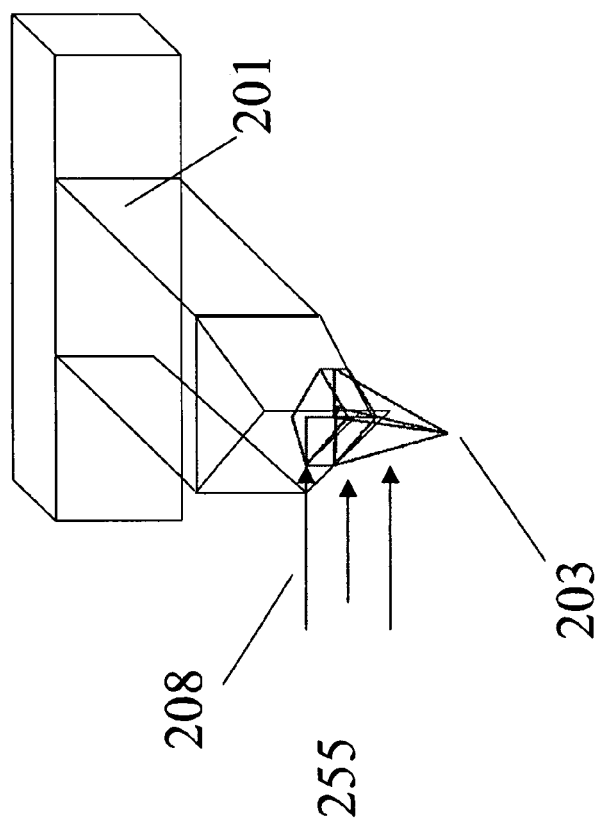
FIG. 18 shows an electromagnetic heating of the tip (example by laser).

The probe tip may be also heated by a laser beam (FIGS. 17 and 18). In FIGS. 17 and 18 a micro-cantilever (201) with a tip (203) is exposed to electromagnetic radiation (255 and 256) of certain wavelength (including laser light and infrared) that induces heating on the tip end or the end part of the cantilever. The radiation may be directed at different angles (255 and 256). Furthermore, the cantilever may be comprised of material that is transparent to certain wavelengths of radiation while the probe tip (203) is not, allowing for localized heating at the tip area.

Figure 19:
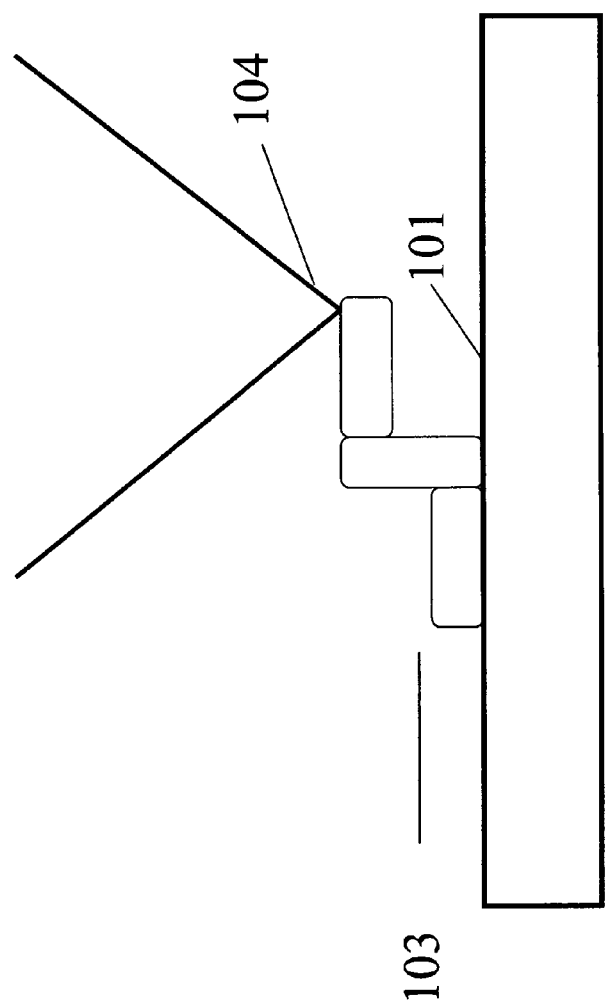
FIG. 19 shows three dimensional CNT growth.

FIG. 19 illustrates a three (3) dimensional device grown with this technique. A nanodevice (such as nanotube) is grown in three dimensions (103) on a substrate (101) using a heated tip (104) which is moved in space in a controlled manner in order to create a three dimensional structure of a desired shape.

Figure 20:
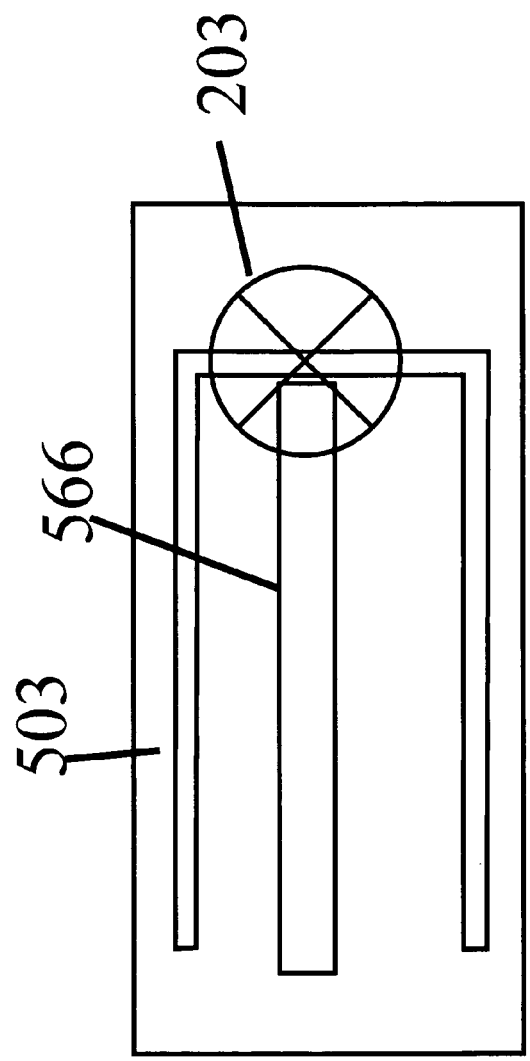
FIG. 20 shows a probe that include an additional electrode for creating an electric field between the sample and the tip.

FIG. 20 illustrates a probe that combines thermal localized heating and also creates an electric field to better control growth. The tip (203) has electrical the traces that connect to a power supply (503) and run through the cantilever (504) an electrode for creates an electric field between the substrate and the probe (566). This probe may be used in contact mode if the electric field electrode is on the side of the tip but not in contact with the substrate. Alternatively, the tip may be scanned at some distance from the sample. The electrode (566) could be at the tip. A dielectric film may insulate the bolometer from the electrode (566). The probe may be heated inductively or using electromagnetic radiation such as lasers. The substrate where the nanodevice is grown is connected the anode or cathode while the electrode (566) is connected to a cathode or anode creating an electric field between the tip and the sample. This method is for localized CVD for example it can be used for growing nanotubes and nanowires using a heated scanning probe or probe array assisted with a plasma to locally heat the area of interest. As the probe is moved, the CNTs will grow in the direction of movement. This method, at higher voltages may be similar to the arc-discharge method where a dc or ac arc voltage is applied between the sample and the tip and the sample is the cathode where the CNT are grown.

Figure 33:
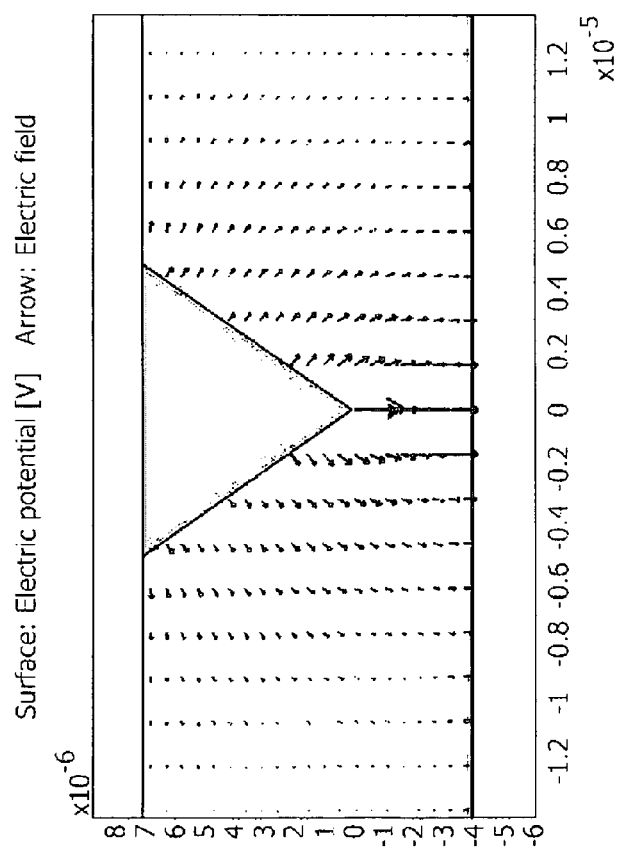
FIG. 33 demonstrates simulations of electric field and potential between the tip and a surface.

FIG. 33 is a simulation of electric field between a tip biased at 1 volt and held 4 micrometers above a surface biased at 0 volts. FIG. 36 shows the electrical potential and the electric field. The arrows in FIG. 36 indicate the electric field strength and direction. The simulations show that the magnitude of the electric field is highest near the apex of the tip. The electric field is much more localized than localized heating. For example, since carbon nanotubes can be aligned and grown with the help of an electric field, it would be possible to localize growth right at the tip.

Figure 30:
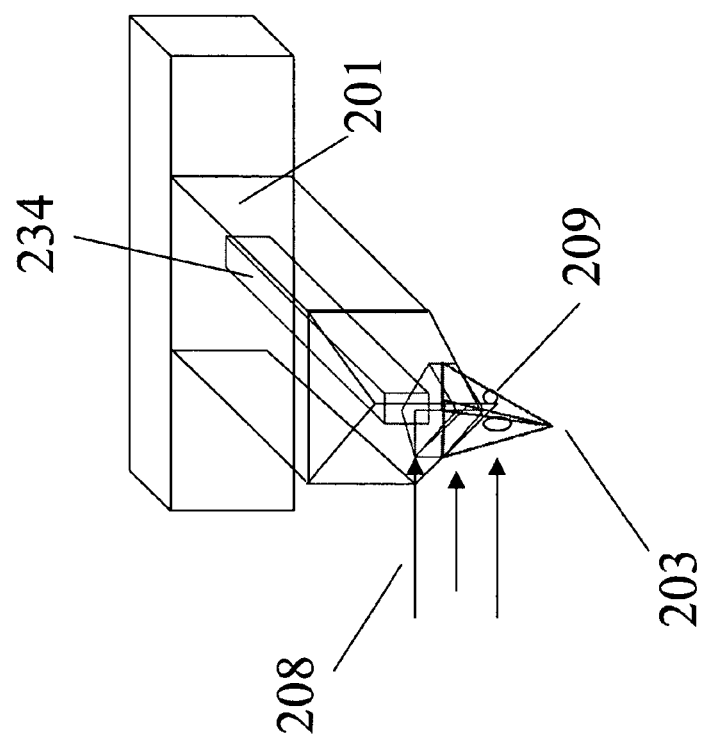
FIG. 30 shows a cantilever with a metal tip for inductive heating and an electrode for biasing the tip and the substrate in order to create an electric field between the tip and the substrate.
Figure 31:
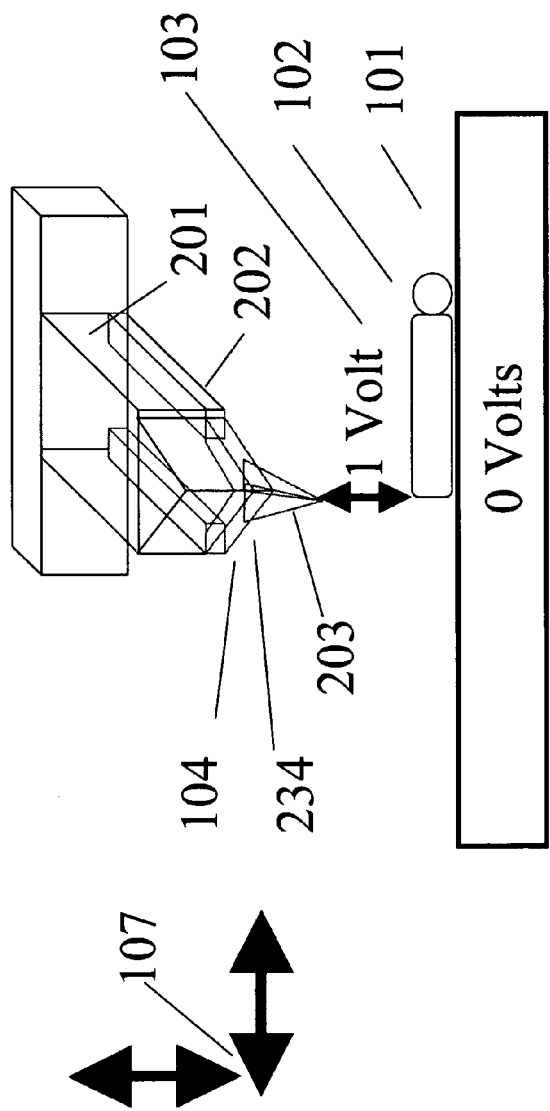
FIG. 31 shows a cantilever with traces and a tip electrically connected to the traces for resistive heating and for creating an electric field between the tip and the substrate.
Figure 32:
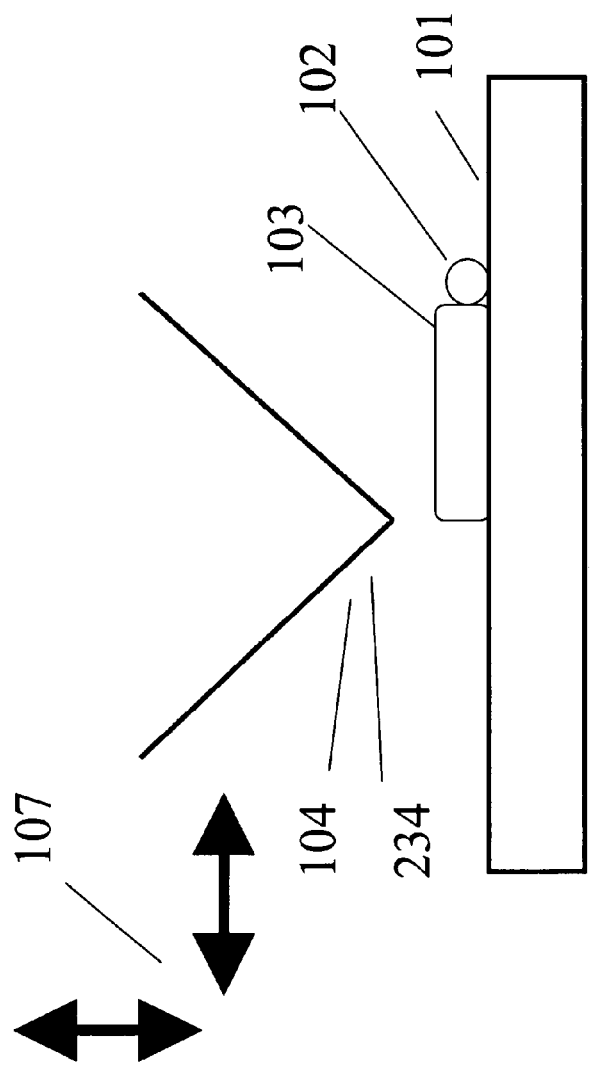
FIG. 32 microcantilever which can be moved in the XYZ direction has heater wires/conductors and a tip with electric field and a heating element.

FIG. 31 illustrates the device in operation. For example a 103 carbon nanotube is grown on the 101 substrate by a 104 heated tip that also includes an electrode for a 203 localized electrical field; the probe may be moved as shown in 108. Heat from the tip 104 and the electric field from the electrode 203 are controlled in order for the appropriate values to be used to produced CNTs with desired properties. FIG. 30 illustrates a 201 microcantilever with a 203 heated tip which is heated with an AC 208 magnetic field that creates 209 Eddy currents on the metal tip. The microcantilever also has one 234 electrode in order to create an electric field with the substrate. The electric field between the tip and the substrate guides the growth direction. In FIGS. 30 and 31, a 201 microcantilever which can be moved in 107 the XYZ direction has 202 heater wires/conductors and a 203 tip with electric field and a heating element 234. The 202 conductors extending to a junction at the distal end of the cantilever beam to allow passage of current through the conductors and through the junction. A 103 nanostructure is grown such as a carbon nanotube on the 101 substrate which is at 0 Volts. In order to both heat the 203 tip and create the 234 electrode for the electric field, voltage is applied in one direction for example 10,000 Volts through the 202 conductors/heated wires and a slightly larger or slightly smaller voltage is applied in the opposite direction for example 10,001 Volts thereby creating an electric field of the differential voltage (for example 1 Volt) between 101 substrate which is maintained at different voltage (for example at 0 Volts) and 203 tip. A 102 catalyst may also be used to facilitate the reaction. In FIGS. 20, 22, 23, 24, 30, 31, 32 the electrode may be on the side of the tip or at the edge of the tip in order to create an electric field between the tip and the sample. Also the electric field may be on the side of the substrate. There may also be a second independently controlled tip which creates an electric field between the first heated tip and the second tip in order to guide the growth of the nanostructure. The heated probe is maintained at a distance from the substrate (1 nm to 1 micron).

Figure 22:
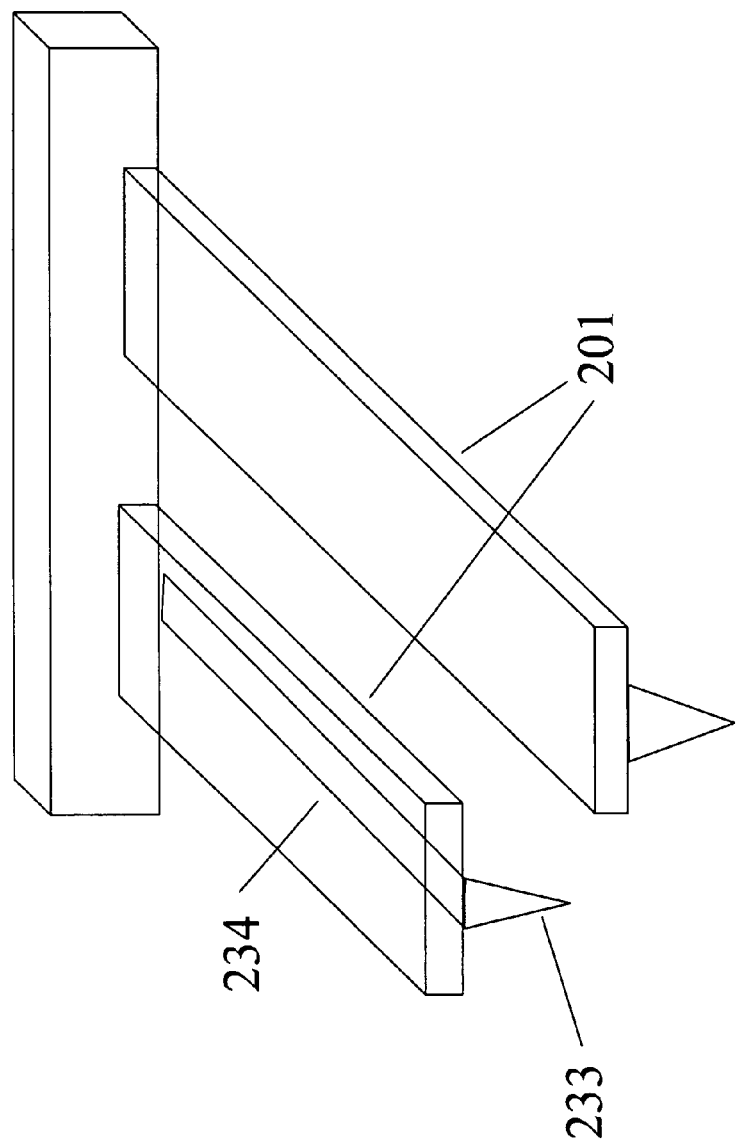
FIG. 22 shows two cantilevers one shorter with an electrode and one longer without an electrode.
Figure 23:
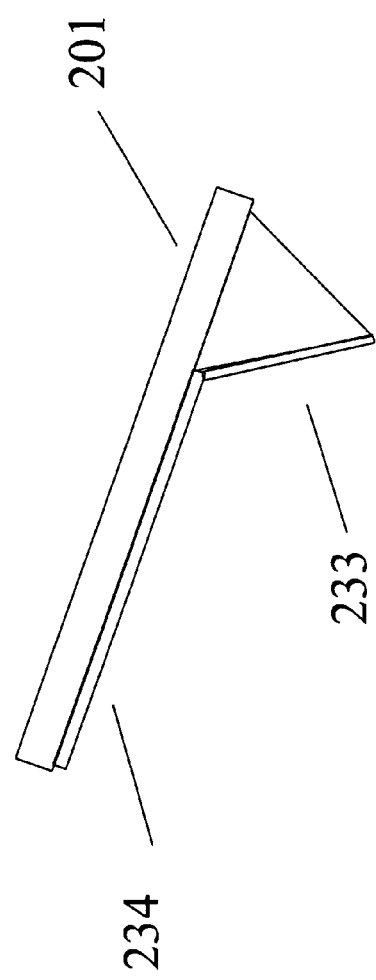
FIG. 23 shows a cantilever with tip and an electrode from the cantilever to the tip end.
Figure 24:
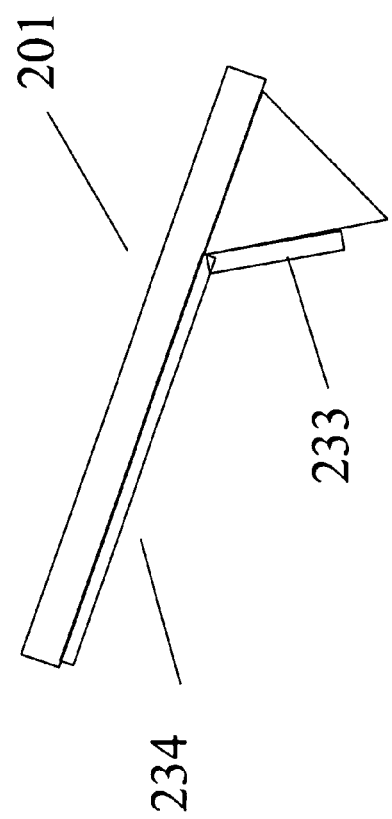
FIG. 24 shows a cantilever with tip and an electrode from the cantilever to the tip but not all the way to the end of the tip.

Other examples of probes used include but are not limited to the following illustrations. FIG. 22, where 201 microcantilever has an 234 electrode and a 233 conductive tip. The shorter cantilever 201 includes an electrode 234 and a 233 conductive tip while the longer is in contact with the sample and is used to provide topographical information. The longer cantilever may also include embedded piezoelectric or piezoresistive elements for topography. In this situation, the long probe makes contact and scans the sample, while a voltage is applied between the second shorted probe and the sample for electric field creation. FIG. 23, includes a 201 microcantilever, an 234 electrode with an 233 electrode at tip. In this case, the probe is moved at a constant height from the sample. FIG. 24, includes a 201 microcantilever, an 234 electrode with an 233 electrode at tip. In this case the electrode is shorter than the tip and an electric field is formed between the electrode 233 and the sample while the tip is in contact with the sample. Arrays like the ones described previously may also be used for higher throughput CNT growth. The probes may simultaneously be heated resistively or inductively or by other methods described previously.

Another method to create very high temperatures is the arc discharge method which may also be used to generate nanoparticles such as nanotubes (CNT's). In an electric arc, an electrical breakdown of a gas occurs. The electric arc produces an ongoing plasma discharge (current flowing through gas). In this case, the arc occurs in a precursor gas-filled space when high a voltage (for example 20V and 100 A) is applied between two conductive electrodes one being the probe tip (anode) and the other being the substrate (cathode). The distance between the probe and the substrate may range from a few nanometers to micrometers. This electric arc has as a consequence very high temperatures and is continuous. A direct-current or in alternating current may be used. Typically, the chamber is evacuated with a vacuum pump, an ambient gas is introduced at the desired pressure, and then a dc arc voltage is applied between the two electrodes. Metal catalysts (Fe, Co, etc.) may also be used to generate single-walled carbon nanotubes (SWNTs). Ambient gases (He, Ar, and CH4) may be used.

Figure 25:
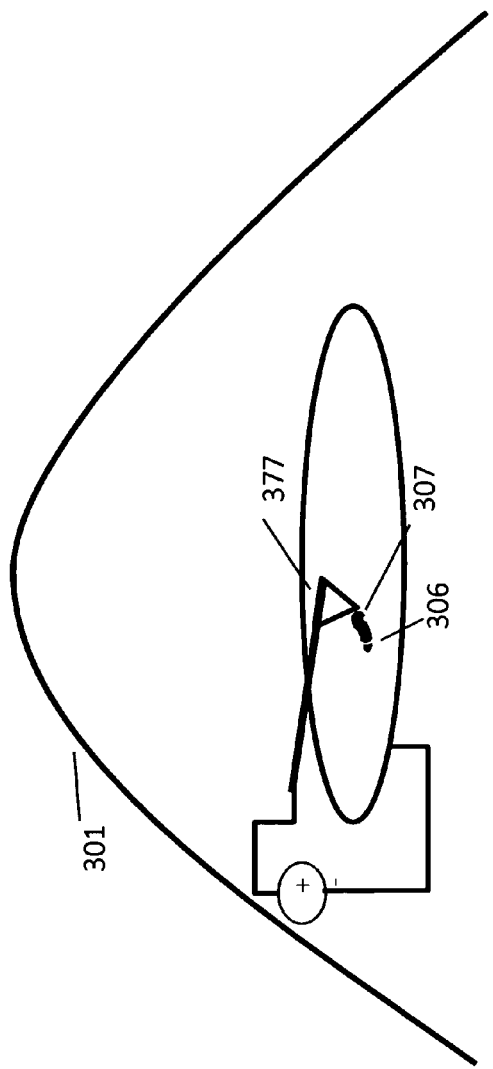
FIG. 25 shows a localized arc discharge in a chamber using a tip with an electrode.
Figure 26:
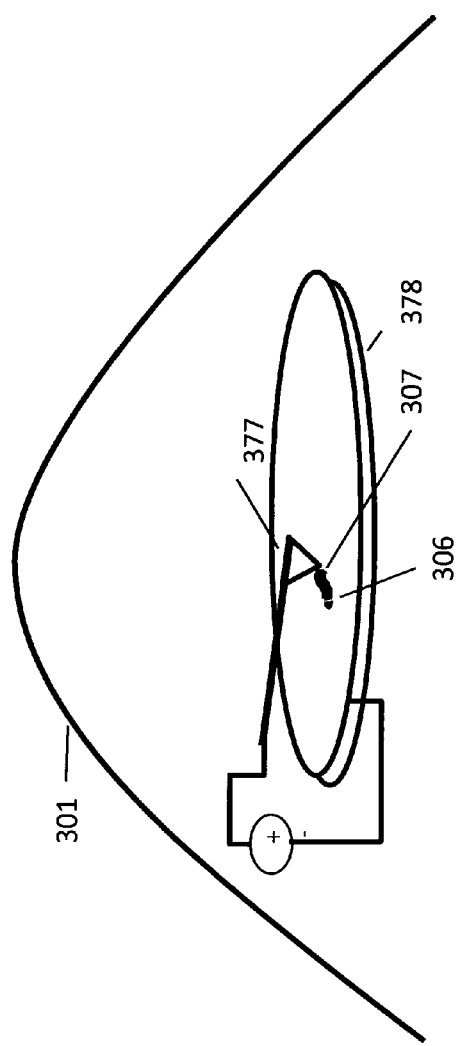
FIG. 26 shows a localized arc discharge in a chamber using a tip with an electrode and a hot plate.
Figure 27:
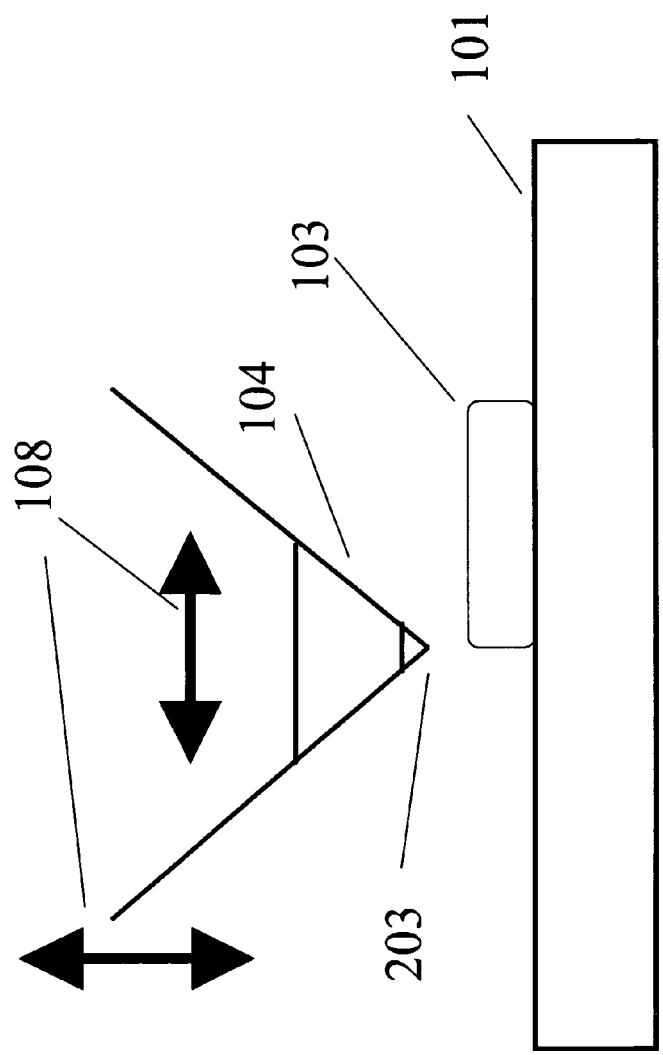
FIG. 27 shows a device with a localized heater and an electrode for localized growth in a chamber.

Examples of probes used include but are not limited to the following illustrations. FIG. 24, where 201 microcantilever has an 234 electrode and a 233 conductive tip. The shorter cantilever 201 includes an electrode 234 and a 233 conductive tip while the longer is in contact with the sample and is used to provide topographical information. The longer cantilever may also include embedded piezoelectric or piezoresistive elements for topography. In this situation, the long probe makes contact and scans the sample, while a voltage is applied between the second shorted probe and the sample for arc discharge creation. FIG. 25, includes a 201 microcantilever, an 234 electrode with an 233 electrode at tip. In this case, the probe is moved at a constant height from the sample. FIG. 26, includes a 201 microcantilever, an 234 electrode with an 233 electrode at tip. In this case the electrode is shorter than the tip and a plasma is formed between the electrode 233 and the sample while the tip is in contact with the sample. Arrays like the ones described previously may also be used for higher throughput CNT growth. These designs can also be used to create an electric field to guide growth as described before.

FIG. 25 illustrates a set-up for arc discharge plasma CNT growth using sharp tips with electrodes. An 301 environmental chamber (for controlling temperature, pressure, and inserting gasses) is used, a 306 catalyst (catalyst with electrical contact) may be deposited on the sample. The catalyst is not necessary. At suitable conditions of pressure, temperature, and voltage through the 377 probe electrode and the sample electrode a 307 nano-particle such as a CNT is grown. The probe 377 is used like a pen to write a nanotube shape in three dimensions. FIG. 26 is very similar to FIG. 25, however, a 378 hot plate is included.

NanoCVD may be used to grow CNT as well as other materials as described previously. The system and method may be used to create three dimensional structures of any shape, form, and application. This method and system may be used to fabricate for instance nanomachines and other useful devices. The end tip design is not limited to a sharp end but it may be of any shape in order to direct the growth of any shape. For example it may be of a rectangle shape to grow a nano-wall. After manipulating the nano-heater (tip or tip array) in 3-dimensions to fabricate nano-devices or nano-machines, the substrate can be dissolved so that the end result can be 3-dimensional nano or micro-devices. This operation resembles a fountain pen that allows one to draw in 3-dimensions.

Figure 34:
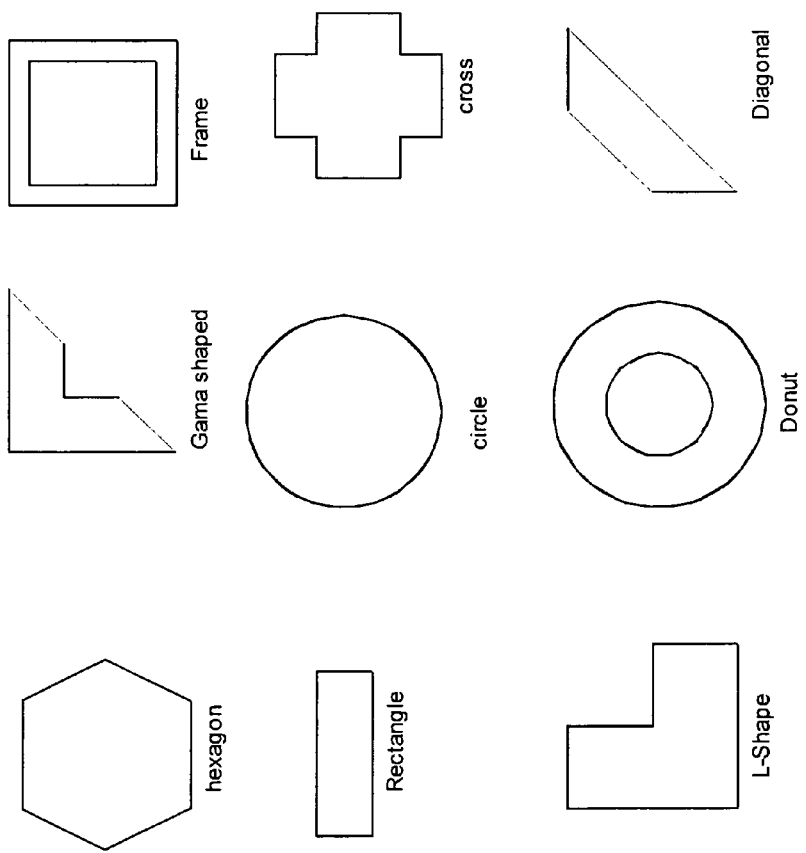
FIG. 34 illustrates a number of alternative tip shapes.

FIG. 34 illustrates various shapes the tip may have in order to create structures with those shapes. It is obvious that any shape tip can be used for growth. Therefore, tip is defined as the end part of the heater, the part of the heater that is in contact with the substrate and is preferably but not necessarily the hottest part of the structure used for nanofabrication. This can be very sharp needle-like, pyramid-like, atomically sharp with a sub-nanometer tip, or of any other shape including the shapes illustrated in FIG. 34.

The tip or tips can be made of a metal such as gold, nickel, titanium, or tungsten. It can also be made from silicon, silicon oxide, doped silicon, amorphous silicon, silicon nitride, titanium nitride, vanadium, silicon carbide, synthetic diamond, or any alloy or material that can be heated to high temperatures. The leads (traces) can be made of the materials mentioned above or a combination of materials to decrease the resistance and the heating on the cantilever if resistive heating is used. Besides the materials mentioned above the resistors (heaters) may be made of platinum, iridium, rhodium or palladium.

Figure 35:
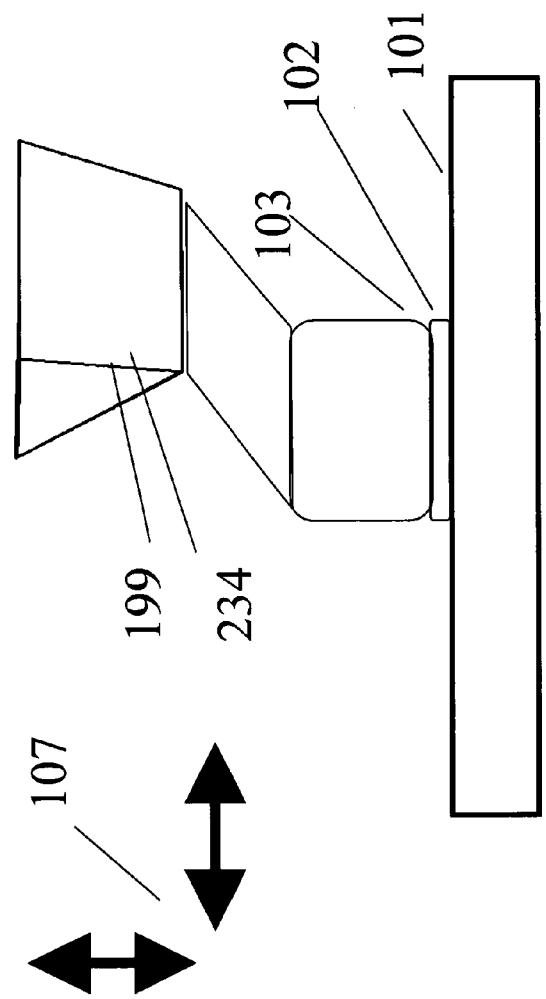
FIG. 35 illustrates the operation of an alternative shape used to grow a nano-wall three dimensional structure.

FIG. 35, illustrates a line-rectangle heater in operation. A 101 substrate with an 102 optional nanoparticle catalyst is used to grow a 103 nano-structure using a 199 heated structure of any shape. The 199 structure is moved in the XYZ direction as illustrated by 107 motion of structure. In this case the heated structure is moved vertically to create a wall and then horizontally. An 234 optional electrode may be included to facilitate the growth.

In addition to a method for CVD, we also claim a localized nano CVD apparatus that comprises of a tip or tip array having at least one characteristic selected from the ones described above. This apparatus has been described in FIG. 1 and in other figures. For example the tip or tip array being a micromachined cantilever beam(s) with a resistive tip(s) at the distal end of the cantilever beam, or, the tip or tip array being a micromachined cantilever beam(s) with a metallic tip at the distal end of the cantilever beam(s) to heat the tip by inductive heating, or the tip or tip array being a micromachined cantilever beam(s) with an electrode extending to the tip(s) at the distal end of the cantilever beam, or, finally, a frame containing a two dimensional array of tips. The tip or tips may be controlled and used for imaging the structured fabricated. There are a number of techniques and tools that can be used for movement control and view the movement of the tip and the device being fabricated. For example a photodetector and a laser can be used to monitor the movement of the tip or tip array. A piezo-resistive element on the cantilever beam(s) can be used to monitor the tip or tip array movement in relation to the substrate. Alternatively a piezo-electric element on the cantilever beam(s) can be used to monitor the tip or tip array movement in relation to the substrate. The tip can be part of a scanning probe microscope, an atomic force microscope, a triangulation meter, a confocal meter, a scanning tunneling microscope. The system can be used in combination with a scanning electron microscope, an optical microscope, or an interferometer. The chamber that the tip operates in may contain a plate with an electrode to place the substrate and apply an electric field between the tip or tip array and the plate—or—a plate with two or more electrodes on the sides to apply an electric field in the direction of the plate. The chamber may contain gas pumps for controlling the pressure inside the chamber. A heated plate may be included to place the substrate on and apply specific temperature to the substrate. Coils may be included for applying an AC magnetic field to inductively heat the tip or tip arrays. The chamber will contain with an inlet and an outlet. A controller for temperature control of the tip or tip array will be also included. A position controller and stage to control the movement of the tip or tip array relative and the substrate relative to each other may be included. One or more precursor gasses may be use. Where optionally the gasses may be at least one of the precursors is a hydrocarbon growth precursor (such as methane) for growing carbon nanotubes.

Thus, it is appreciated that the optimum dimensional relationships for the parts of the invention, to include variation in size, materials, shape, form, function, and manner of operation, assembly and use, are deemed readily apparent and obvious to one of ordinary skill in the art, and all equivalent relationships to those illustrated in the drawings and described in the above description are intended to be encompassed by the present invention. Furthermore, other areas of art may benefit from this method and adjustments to the design are anticipated. Thus, the scope of the invention should be determined by the appended claims and their legal equivalents, rather than by the examples given.

We claim:

1. A method of localized chemical vapor deposition for generating nanostructures and microstructures, the method comprising:
    placing a substrate in a chamber;
    bringing a movable apparatus with a sharp tip in contact with or at a constant distance from the substrate;
    wherein said movable apparatus includes an electrical conductor;
    reducing the pressure of said chamber to below atmospheric pressure using a pump connected to said chamber;
    passing an electric current through said electrical conductor thereby heating said tip to a specific temperature by resistive heating;
    heating the substrate by means of conduction or convection heat transfer from the tip to the substrate;
    introducing at least one carrier gas in the chamber;
    introducing at least one precursor gas in said chamber to cause a chemical reaction on the surface of said substrate;
    moving said substrate and said tip relative to each other; and
    generating a structure.

2. A method of localized chemical vapor deposition for generating nanostructures and microstructures, the method comprising:
    placing a substrate in a chamber;
    bringing a movable apparatus with a sharp tip in contact with or at a constant distance from the substrate;
    wherein said movable apparatus includes an electrically conducting object;
    lowering the pressure of said chamber to below atmospheric using a pump connected to said chamber;
    passing a high-frequency alternating current through an electromagnet in proximity to said electrically conducting object thereby heating said tip to a specific temperature by induction heating;
    heating the substrate by means of conduction or convection heat transfer from the tip to the substrate;
    introducing at least one carrier gas in the chamber;
    introducing at least one precursor gas in said chamber to cause a chemical reaction on the surface of said substrate;
    moving said substrate and said tip relative to each other; and
    generating a structure.

3. The method according to claim 1 or 2, wherein the sharp tip comprises a one or two dimensional array of tips.

4. The method according to claim 1 or 2, wherein at least one catalyst is deposited on said substrate prior to inserting substrate in the chamber.

5. The method according to claim 1 or 2, wherein the tip shape is a polygon with a cross-sectional width between one micron and one nanometer.

6. The method according to claim 1 or 2, wherein the step of moving said substrate and said tip relative to each other is a vertical movement, generating a vertically aligned structure on said substrate.

7. The method according to claim 1 or 2, wherein the step of moving said substrate and said tip relative to each other is a vertical and horizontal movement, generating a three-dimensional structure on said substrate.

8. The method according to claim 1 or 2, wherein said tip temperature is raised and lowered in a predetermined manner.

9. The method according to claim 1 or 2, wherein said tip temperature is lowered gradually to anneal the nanostructure in contact with the tip.

10. The method according to claim 1 or 2, wherein said tip is heated and cooled to alternate growth and annealing steps.

11. The method according to claim 1 or 2, wherein said tip is used to grow a nanowire to connect two structures on said substrate.

12. The method according to claim 1 or 2, wherein an electric field is applied between said tip and said substrate.

13. The method according to claim 1 or 2, wherein said substrate is placed on a variable temperature plate to apply specific temperature.

14. The method according to claim 1 or 2, wherein an electric field is applied between two sides of the substrate.

15. The method according to claim 1 or 2, wherein said movable apparatus is a micromachined cantilever beam with an electrical conductor and a sharp tip at the distal end of said cantilever beam, said apparatus is attached to a micromanipulator, and said substrate is placed on an XYZ stage.

16. The method according to claim 1 or 2, wherein said movable apparatus is a micromachined cantilever beam with a sensing element on said cantilever to monitor the tip movement in relation to the substrate, wherein said sensing element is piezoresistive or piezoelectric.

17. The method according to claim 1 or 2, wherein the apparatus further comprises means to monitor the tip movement in relation to the substrate, the means selected from the group consisting of: a laser light directed to said apparatus and a photodetector to detect the reflected said laser light from the apparatus, an atomic force microscope, a triangulation displacement meter, a confocal displacement meter, a scanning electron microscope, an optical microscope, and an interferometer.

18. The method according to claim 1 or 2, wherein said precursor gas is a hydrocarbon, an organometal, an organic material, or other material capable of growing on the substrate a grown material, wherein said grown material is selected from the group consisting of: dielectrics, titanium nitride, SiO2, silicon-germanium, silicon, silicon oxynitride, silicon nitride, silicon carbide, carbon nanotubes, carbon fiber, metals, and synthetic diamonds.

19. The method of claim 1 or 2, wherein said tip is metallic or it is coated with a metal film.

* * * * *